United States Patent [19]

Ohkase et al.

[11] Patent Number: 5,536,918
[45] Date of Patent: Jul. 16, 1996

[54] HEAT TREATMENT APPARATUS UTILIZING FLAT HEATING ELEMENTS FOR TREATING SEMICONDUCTOR WAFERS

[75] Inventors: Wataru Ohkase, Sagamihara; Yasushi Yagi, Zama; Satoshi Kawachi, Yokohama, all of Japan

[73] Assignee: Tokyo Electron Sagami Kabushiki Kaisha, Japan

[21] Appl. No.: 248,621

[22] Filed: May 16, 1994

Related U.S. Application Data

[63] Continuation of Ser. No. 928,111, Aug. 11, 1992, abandoned.

[30] Foreign Application Priority Data

Aug. 16, 1991 [JP] Japan .................. 3-229694
Aug. 16, 1991 [JP] Japan .................. 3-229695
Aug. 16, 1991 [JP] Japan .................. 3-229696
Aug. 16, 1991 [JP] Japan .................. 3-229698

[51] Int. Cl.⁶ .............. H01L 21/205; H01L 21/22; H01L 21/285; H01L 21/31
[52] U.S. Cl. .............. 219/390; 392/418; 118/724; 118/500
[58] Field of Search ............ 432/239; 34/266–269; 392/416, 418; 219/390, 405, 411; 118/724, 725, 50.1, 728, 730, 500

[56] References Cited

U.S. PATENT DOCUMENTS

| | | | |
|---|---|---|---|
| 3,717,439 | 2/1973 | Sakai | 219/385 |
| 4,403,567 | 9/1983 | da Costa et al. | 118/724 |
| 4,760,244 | 7/1988 | Hokynar | 219/390 |
| 4,788,416 | 11/1988 | Price et al. | 219/516 |
| 4,857,689 | 8/1989 | Lee | 432/128 |
| 4,943,234 | 7/1990 | Sohlbrand | 432/152 |
| 5,116,784 | 5/1992 | Ushikawa | 118/715 |
| 5,131,842 | 7/1992 | Miyazaki et al. | 118/725 |
| 5,148,714 | 9/1992 | McDiarmid | 219/390 |
| 5,171,972 | 12/1992 | Hidano | 219/390 |
| 5,233,163 | 8/1993 | Mieno et al. | 219/390 |
| 5,308,955 | 5/1994 | Watanabe | 219/390 |
| 5,393,349 | 2/1995 | Ohkase | 118/725 |

FOREIGN PATENT DOCUMENTS

| | | | |
|---|---|---|---|
| 60-123025 | 7/1985 | Japan . | |
| 60-170233 | 9/1985 | Japan | 118/728 |
| 63-186424 | 8/1988 | Japan | 392/411 |
| 64-11324 | 1/1989 | Japan | 219/405 |
| 1-256117 | 10/1989 | Japan | 118/728 |
| 2-125610 | 5/1990 | Japan | 219/443 |
| 2-174115 | 7/1990 | Japan | 118/728 |
| 3-132014 | 6/1991 | Japan | 118/728 |
| 4-51538 | 2/1992 | Japan . | |
| 5-121342 | 5/1993 | Japan | 392/416 |
| 5-121341 | 5/1993 | Japan | 392/416 |
| 5-144758 | 6/1993 | Japan | 392/416 |
| 9219790 | 11/1992 | WIPO | 427/585 |

*Primary Examiner*—John A. Jeffery
*Attorney, Agent, or Firm*—Beveridge, DeGrandi, Weilacher & Young

[57] ABSTRACT

A heat treatment apparatus including a flat heat source having a plural number of ring-shaped heating units of different diameters arranged concentrically and so as to face a processing surface of a semiconductor wafer for example, a heat control portion which performs either independent or batch control of a plural number of ring-shaped heating units, a process tube which houses the object for processing, and a movement mechanism which brings a processing surface of the object for processing and the flat heat source into relative proximity. By this configuration, it is possible to have fast heat treatment such as oxidation and diffusion processing, or CVD processing, to a uniform temperature for the entire processing surface of a flat object for processing.

2 Claims, 19 Drawing Sheets

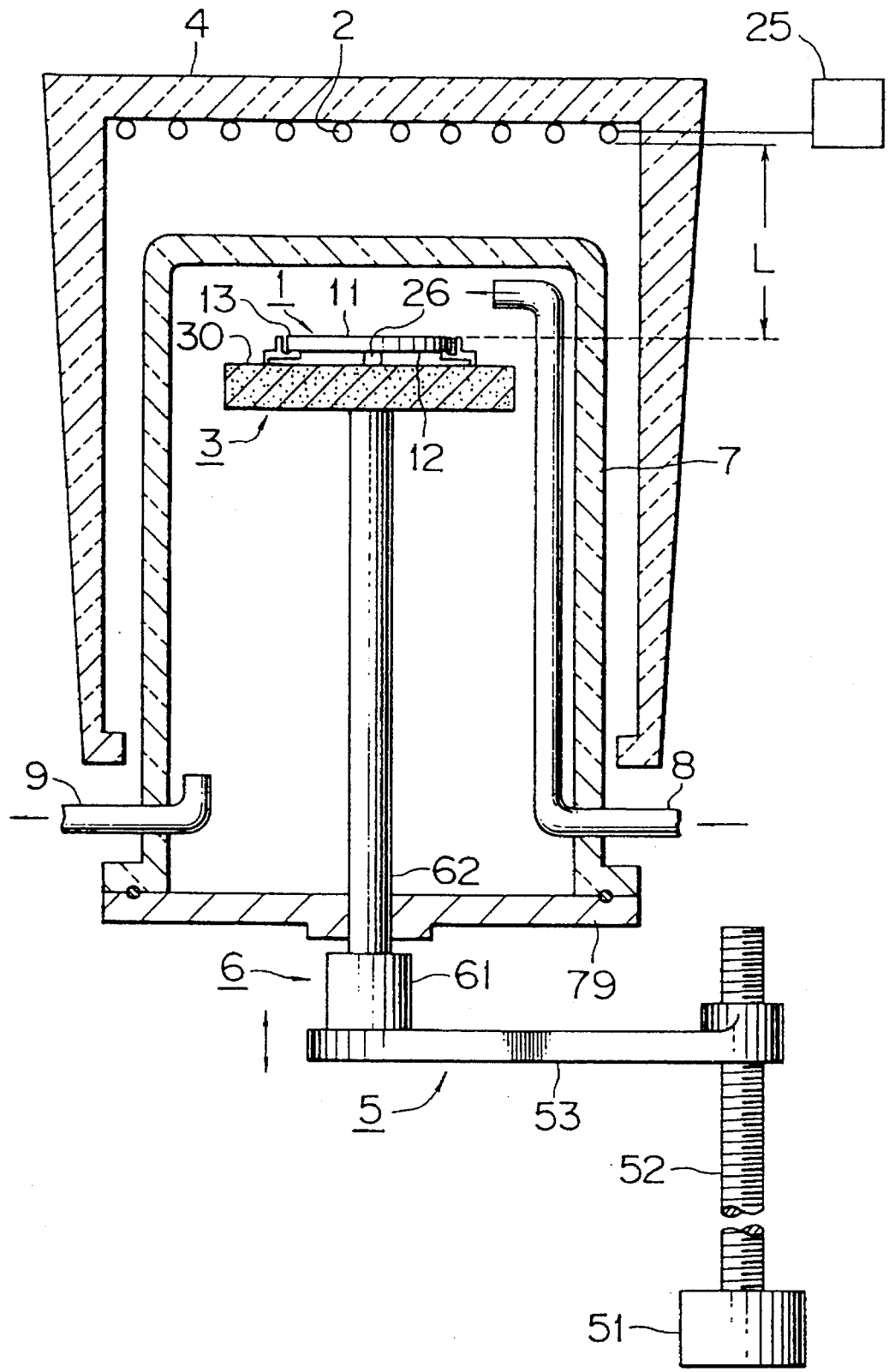
F I G. 11

H > h
H' > h

HEAT TREATMENT APPARATUS UTILIZING FLAT HEATING ELEMENTS FOR TREATING SEMICONDUCTOR WAFERS

This application is a continuation of Ser. No. 928,111 filed Aug. 11, 1992, now abandoned.

BACKGROUND OF THE INVENTION

The present invention relates to heat treatment apparatus for the heat treatment of flat objects of processing such as semiconductor wafers, LCD (liquid crystal displays) and the like.

In the manufacture of semiconductor devices for example, processes such as oxidation and diffusion processes, CVD and others are used for semiconductor wafers.

In particular, there has been recent process in degrees of fineness of the design rules for semiconductor devices, and these have changed from 0.4 μm to 0.2 μm. In addition, the semiconductor wafers themselves have been becoming larger, and have changed from 8 inches to 12 inches in diameter and one important problem is the development of technologies for fast heat treatment and which can be used with technologies for the growth of extremely thin films over such a larger area.

More specifically, in semiconductor wafer process processing, one necessary condition is that the thermal budget (or the heat history) be made as small as possible. For example, in the growth of an extremely thin film of a capacitor insulation film or a gate oxidation film by doping processing for 50–100 Å it is essential that the heat treatment be performed quickly, that is, in as short a time as possible.

Not only this, PN junctions for example, have been becoming as thin as 0.1 μm or less, and enabling them to have lower resistances, and the growth of junctions to surfaces of arbitrary shapes requires that the generation of crystal faults be prevented along with the deterioration of the film when the junction is made. However, the active region of PN junctions is narrow and so it is again necessary that the heat treatment be performed as quickly as possible.

In addition, in the growth of a LOCOS oxidation film for example, the synergetic effect of compression stresses in adjacent LOCOS oxidation films is magnified due to the heat cycle and it is easy for changes in the surface potential, leak currents, and reduction of the resist voltage reliability to occur. With respect to these problems, it is necessary to prevent them by reducing the heat cycle by having fast heat treatment of semiconductor wafers.

Also, when there is the use of, for example, of materials having a highly dielectric conductors in the growth of a capacity insulation films, it is necessary to have a system which enables compound process processing by enabling doping and metal film growth to enable the growth of metal oxides (such as $Ta_2O_5$ and the like) and polyamides (passivation films).

Thus, the current status of the technology is that semiconductor wafers are becoming larger from 8 inches to 12 inches, and that it is necessary to have fast and uniform heating while reducing the temperature differential between the central and the peripheral portions of the semiconductor wafer, reducing the occurrence of slip, distortion and warping which easily occur in semiconductor wafers, and to prevent them from becoming a hindrance in the manufacture of semiconductor devices.

However, in a conventional type of, vertical batch processing type of heat treatment apparatus, there is a a cylindrical heat source which surrounds the semiconductor wafers which are stacked and housed in a wafer boat of glass, and the semiconductor wafers are heated from the outside towards the center. Because of this, when there is fast heating of the semiconductor wafers, there is a large thermal gradient between the peripheral portions and the center portion of the semiconductor wafers and there is the problem that it is not possible to have uniform heating.

SUMMARY OF THE INVENTION

With respect to this problem, the present invention has as an object the provision of a heat treatment apparatus which has temperature control of a flat heat source divided into a plural number of concentric rings, and therefore enable fast heat treatment to a uniform temperature of the entire surface of a flat object to be treated.

In order to attain this objective, the heat treatment apparatus of the present invention is characterized in being provided with a flat heat source which is divided into a plural number of ring-shaped concentric heating units of different diameters, and which are arranged so as to face a processing surface of a flat object to be processed, a heating control portion which has either independent or batch control of the plural number of concentric ring-shaped heating units, and a movement mechanism which moves the object to be treated and the ring-shaped heating units into relative proximity.

In the present invention, a flat heat source is arranged so as to face a processing surface of a flat object to be treated and so the heat radiated from the flat heat source is irradiated as parallel rays perpendicularly to the entire surface of the object to be treated. In addition, the flat heat source is configured from a plural number of concentric ring-shaped units and a heating control portion is provided for either the individual or batch control of this plural number of concentric ring-shaped units so that it is possible for the flat heat source to have temperature control performed for each of the plural number of concentric ring-shaped units into which it is divided. As a result, it is possible to have uniform heating to a high accuracy for the entire surface of the object to be treated. In addition, the movement mechanism quickly moves the object to be treated and the ring-shaped heating units into relative proximity so that fast heat treatment is possible.

The following is a description of embodiments of the present invention. Moreover, the embodiments described below use the example of a semiconductor wafer as the flat object to be treated but the present invention is not limited in application to semiconductor wafers, and can also be applied to LCD and other flat objects to be treated.

BRIEF DESCRIPTION OF THE DRAWINGS

FIG. 11 is an outline view of a fifth embodiment of the heat treatment apparatus of the present invention;

DETAILED DESCRIPTION OF PREFERRED EMBODIMENTS

First Embodiment

The following is a description of a first embodiment of the present invention applied to a heat treatment apparatus for performing oxidation and diffusion processing for semiconductor wafers.

Figure 1:
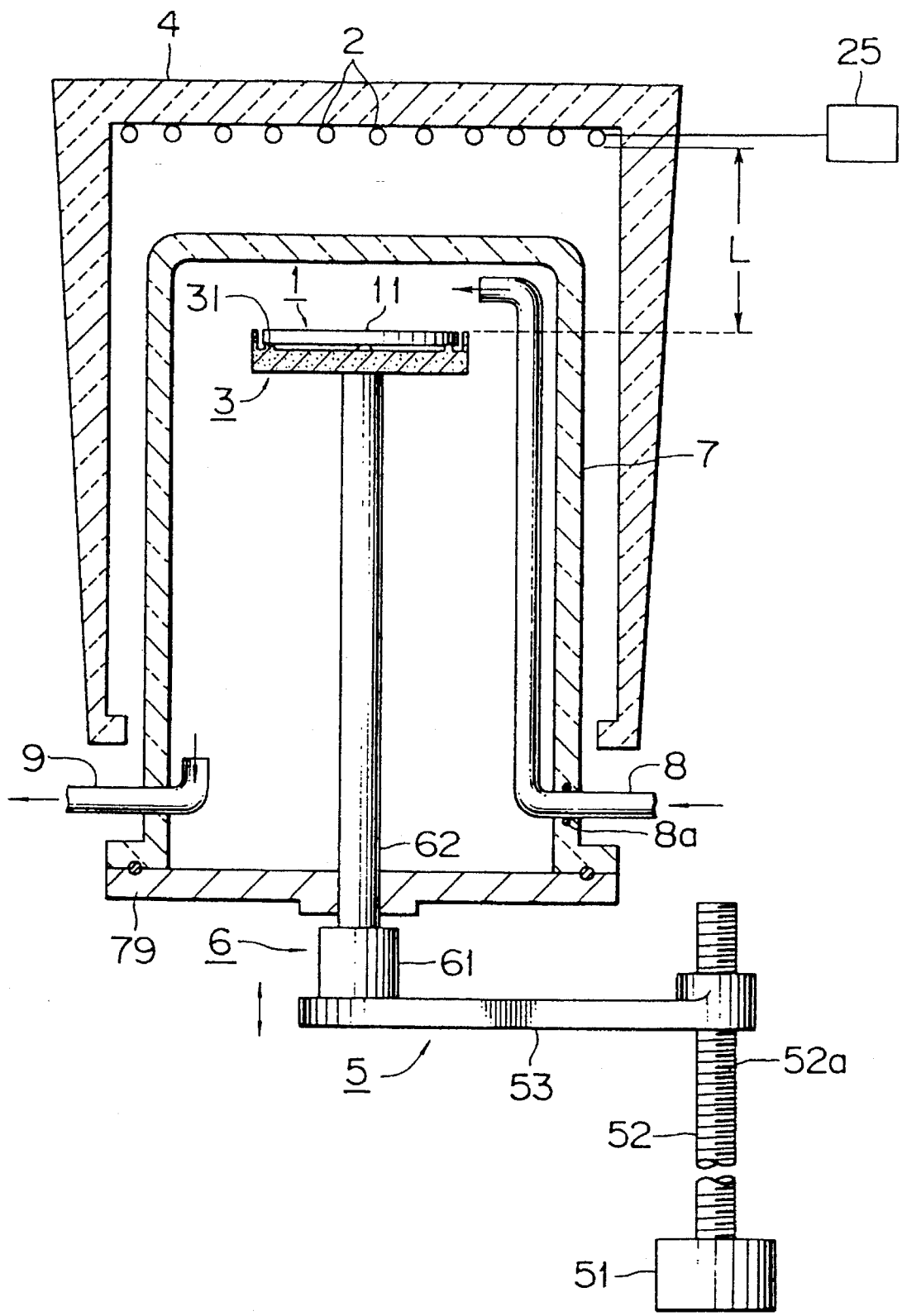
FIG. 1 is an outline view of a flat heat source which is a first embodiment of the heat treatment apparatus of the present invention.
Figure 2:
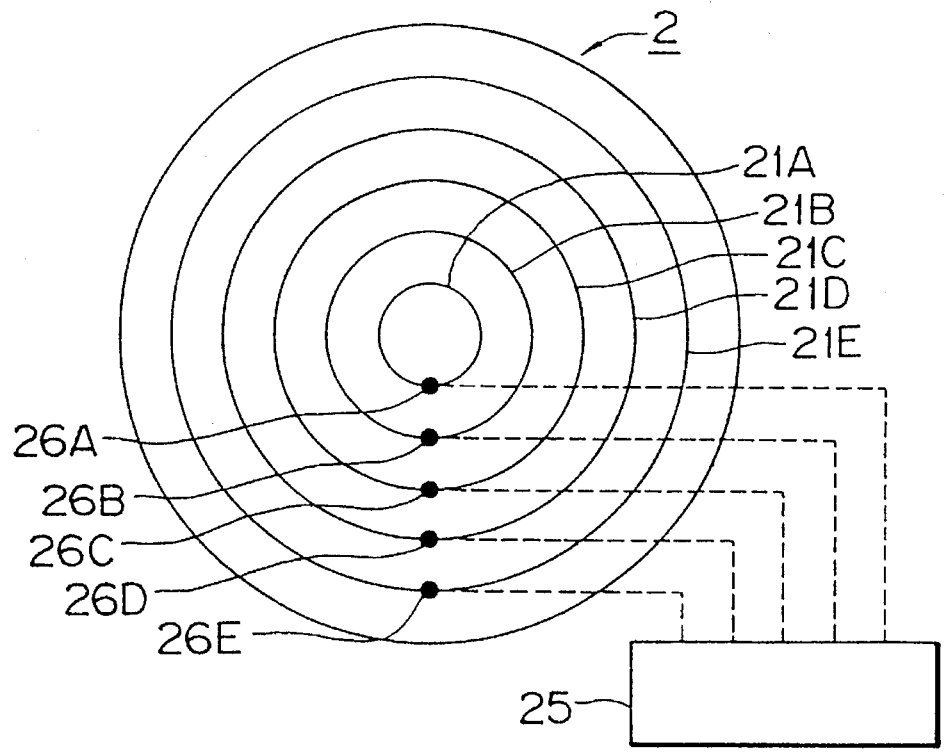
FIG. 2 is a view describing a specific shape of the flat heat source shown in FIG. 1.

FIG. 1 is an outline view of a first embodiment of the heat treatment apparatus of the present invention, and FIG. 2 is a view describing ring-shaped flat heat source used in the heat treatment apparatus of FIG. 1.

The main configuring portions of this heat treatment apparatus are a flat heat source 2 which heats the semiconductor wafer 1 which is the flat object for processing, a heating control portion 25, a wafer holder 3, heat retention material 4 and a movement mechanism 5.

Three of four holding protrusions 31 for example, formed as a unit with the peripheral edge portion of the wafer holder 3 come into contact with the rear surface opposite the processing surface 11 of the semiconductor wafer 1 and hole the semiconductor wafer 1 on the wafer holder 3.

This wafer holder 3 is desirably formed from a material such as high-purity silicon-carbide (SIC) which has excellent heat resistance and little contamination. In particular, high-purity silicon-carbide (SIC) has a better heat resistance than silica glass ($SiO_2$) in that it can sufficiently withstand temperatures of approximately 1200° C. and is therefore suitable as a material for oxidation and diffusion processing.

The flat heat source 2 is provided fixed to the inner wall of the upper portion of the heat retention material 4 in for example, the portion immediately above and facing the processing surface 11 of the semiconductor wafer 1. Moreover, this flat heat source 2 can be arranged immediately above the semiconductor wafer 1 as shown in FIG. 1, or can be arranged immediately below the processing surface 11 of the semiconductor wafer 1.

As shown in FIG. 2, the flat heat source 2 is configured from for example, five ring-shaped and concentric heating units 21A, 21B, 21C, 21D and 21E having different diameters.

Each of the ring-shaped heating units 21A–21E are respectively provided with temperature sensors 26A–26E comprising thermocouples, and these temperature sensors 26A–26E are connected to a heating control portion 25. The heating control portion 25 uses signals from the temperature sensors 26A–26E as the basis for independent control of each of the ring-shaped heating units 21A–21E. For example, heat is more easily radiated from the peripheral portion than the center portion of the semiconductor wafer 1, and so temperature control so that the ring-shaped heating units on the side of the periphery become a higher temperature than those at the center of the flat heat source 2 is performed so that there is uniform heat treatment for the entire surface of the semiconductor wafer 1.

Moreover, there can be completely independent heating control for each of the five ring-shaped heating units 21A–21E or there can be control so that the heating units are suitably grouped into a plural number of groups which are then controlled. For example, the ring-shaped heating units 21A and 21B can be one group which have shared control, and the ring-shaped heating units 21C–21E can be another group which has shared control.

In addition, instead of using a temperature sensor to detect the temperature of each of the ring-shaped heating units of the flat heat source 2, a radiant heat gauge can be used to directly measure the temperature for each of the ring-shaped bands of the semiconductor wafer 1, and the detection signals can be used as the basis for performing temperature control by the heating control portion 25.

The minimum gap distance L (See FIG. 1) between this flat heat source 2 and the semiconductor wafer 1 should be made short in view of minimizing the size of the heat treatment apparatus but should be made longer in view of having uniform heating of the entire surface of a semiconductor wafer 1 having a large area. More specifically, the distance which obtained to satisfy both of these conditions to a certain extent is in the range of 50–150 mm for example. Here, the "minimum separation distance" is the distance from the required position to the flat heat source 2 when there is process processing in the status where the semiconductor wafer 1 is stopped and is stationary.

The ring-shaped heating units 21A–21E of the flat heat source 2 can be configured from Kanthal (trade name) which is an alloy wire of molybdenum silicide ($MoSi_2$), iron (Fe), chromium (Cr) and aluminum (Al), or some other resistor heat generating unit which has been made into a plate shape. For example, molybdenum silicide ($MoSi_2$) can be used as a single wire, and Kanthal can be used as a coil. In particular, it is possible for molybdenum silicide ($MoSi_2$) to sufficiently withstand high temperatures of up to approximately 1800° C. and so it is a favorable material for an apparatus for the oxidation and diffusion processing of semiconductor wafers.

It is desirable that the outer diameter of the heat emitting surface configured by the ring-shaped heating units of the flat heat source 2 be twice the outer diameter of the semiconductor wafer 1. A flat heat source 2 which satisfies conditions such as these can sufficiently reduce the temperature difference between the center portion and the peripheral portion of the semiconductor wafer 1 and can enable heat treatment to a uniform temperature for the entire surface of the semiconductor wafer 1.

It is desirable that the heat emitting surface of the flat heat source 2 be arranged parallel to the processing surface 11 of the semiconductor wafer 1. In addition, the heat emitting surface of the flat heat source 2 can be one which is entirely flat, or its peripheral portion can be can curved so as to approach the processing surface 11 of the semiconductor wafer 1. The temperature of the flat heat source 2 is desirably some 100°–300° C. higher than the maximum usage temperature of the semiconductor wafer 1.

Figure 3:
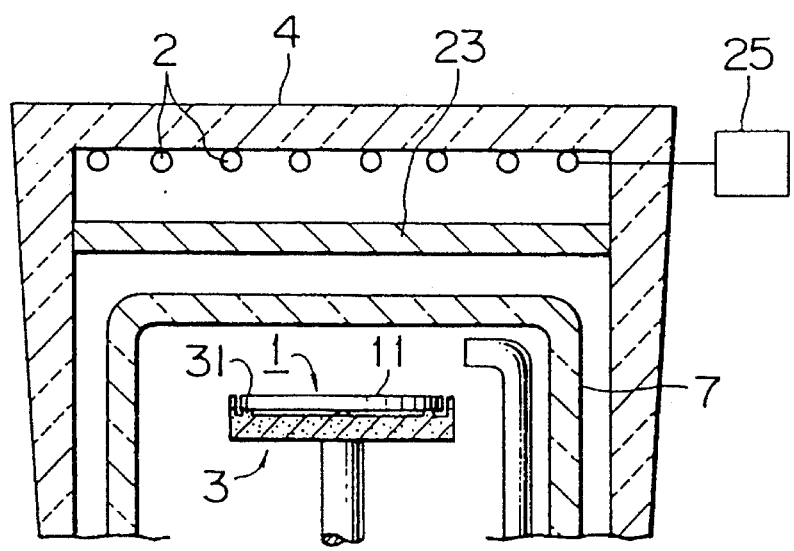
FIG. 3 is an outline view of a heat treatment apparatus having a heat baffle member between the flat heat source and the semiconductor wafer.

Also, as shown in FIG. 3, a flat heating baffle member 23 can be arranged between the flat heat source 2 and the semiconductor wafer 1. This heating baffle member 23 controls the heat radiated from the flat heat source 2 so that it is in the vertical direction with respect to the semiconductor wafers 1 and eliminates unevennesses in the heat generated in the flat heat source 2.

Furthermore, the heating baffle member 23 is configured from a material such as high purity carbon silicide (SIC) which has little contamination, and furthermore, is completely separated from the flat heat source 2 by a gap so that it is possible to effectively prevent contamination due to said heavy metals even when the flat heat source 2 is configured from a material which includes heavy metals which are a source of contamination.

This heating baffle member 23 is arranged so as to face the processing surface 11 of the semiconductor wafer 1 and the outer diameter is desirably the same as that of the flat heat source 2 in that it is desirably two times or more the outer diameter of the semiconductor wafer 1.

Figure 27:
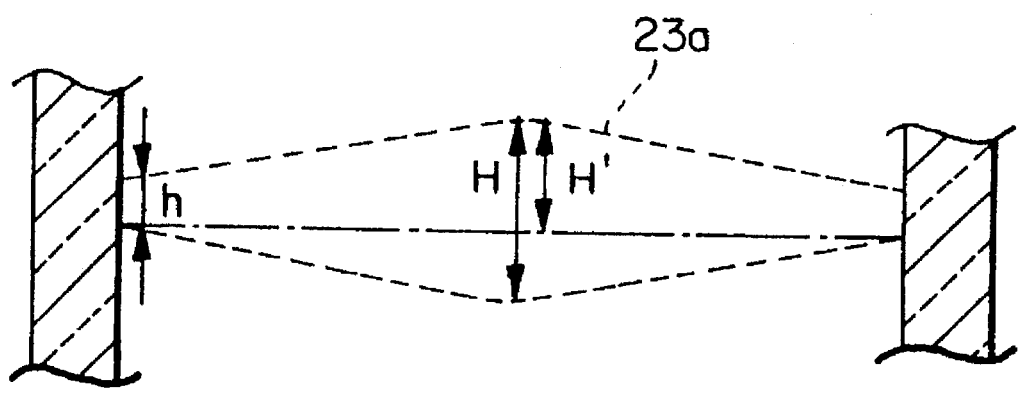

In addition, FIG. 27 illustrates a heating baffle member 23a that is desirably thicker in the center portion that it is at the peripheral portions. Such a sectional shape reduces the heat dispersion from the peripheral portion of the semiconductor wafer 1 and enables a high uniformity of temperature to be maintained between the center portion and the peripheral portions.

Moreover, this heating baffle member 23a can have a curved shape for which the peripheral portion is closer to the semiconductor wafers 1. By having such a curved peripheral portion, the heat dispersion of the peripheral portion of the semiconductor wafers 1 is reduced and it is possible to have a high uniformity of temperature to be maintained between the center portion and the peripheral portions.

The movement mechanism 5 for the wafer holder 3 shown in FIG. 1 quickly raises the wafer holder 3 with respect to the flat heat source 2 so that it is close to it, and then quickly lowers the wafer holder 3. This mechanism is configured from a motor 51, a drive shaft 52 and a drive arm 53.

The motor 51 is coupled to the drive shaft 52 and rotational control of the drive shaft 52 is performed by the motor 51. The drive shaft 52 is provided with a screw 52a and engages with the one end of the drive arm 53 via this screw 52a. The other end of the drive arm 53 is coupled to a the wafer holder 3 via the rotating shaft 62 and the motor 61 of the rotation mechanism 6.

When the motor 51 rotates the drive shaft 52, the action of the screw provided to this drive shaft 52 either raises or lowers the drive arm 53 and the wafer holder 3 is either raised or lowered by this movement of this drive arm 53.

Accordingly, the control of the rotational speed of the motor 51 by the control circuit enables suitable adjustment of the speed of raising or lowering the wafer holder 3. Here, the movement distance of the wafer holder 3 is desirably between 300–600 mm for example, and the movement speed is desirably from 50–200 mm/sec or more.

When there is oxidation and diffusion processing for a semiconductor wafer 1 the rotation mechanism 6 rotates and moves the semiconductor wafer 1 around the axis of its center. In the rotation mechanism 6, the motor 61 rotates the semiconductor wafer 1 along with the wafer holder 3 by the rotation of the rotating shaft 62.

The heat retention material 4 shown in FIG. 1 is comprised of aluminum ceramic for example, and decreases in thickness (i.e., is tapered) towards the lower portion so that can be a suitable temperature gradient along the direction of movement of the semiconductor wafers 1. More specifically, there is less of a temperature retention effect for the closer towards the bottom portion. It is desirable that the lower end portion of the heat retention material 4 be provided with a cooling means (not shown) to quickly cool the semiconductor wafers 1 after the completion of heat treatment. This cooling means can use a cooling medium such as ammonia, iodine disulfide, water or the like. The cooling medium uses its latent heat to cool to a temperature of approximately 300°–400° C. The inner diameter of the heat retention material 4 is desirably determined in consideration of the temperature of the semiconductor wafers 1. For example, when the semiconductor wafers 1 have a diameter of 8 inches, the inner diameter is desirably set to approximately twice this, or to 400–500 mm.

The process tube 7 shown in FIG. 1 can be formed from silica glass ($SiO_2$) or the like. This process tube 7 is formed in a cylindrical shape which has an opening at its lower end, and the semiconductor wafers 1 and the wafer holder 3 are separated from the flat heat source 2 and the heat retention material 4 and the atmosphere of the semiconductor wafers 1 is separated from the external atmosphere.

In addition, a gas introduction tube 8 has one end protruding from the bottom portion of the process tube 7 to outside, and the other end is positioned so as to extend upwards in side the process tube 7 and to open diagonally above the semiconductor wafers 1. This gas introduction tube 8 is airtightly fixed by a screw-tightened O-ring, with respect to the wall portion of the process tube 7.

Furthermore, the gas exhaust tube 9 is provided to the bottom portion of the process tube 7 and so that it communicates the inside and outside of the container 7.

In the status where the wafer holder 3 is raised by the movement mechanism 5 and the semiconductor wafers 1 are completely housed inside the process tube 7, the process tube 7 is placed in a status where it is made airtight by a circular cap portion 79.

The process gas is introduced into the process tube 7 from the gas introduction tube 8 and the heat radiated from the flat heat source 2 makes the temperature inside the process tube 7 the required temperature necessary for oxidation and diffusion processing. The temperature inside the process tube 7 is a constant temperature if the distance from the flat heat source 2 is constant and so it is possible to have the required temperature (1200° C. for example) necessary for oxidation and diffusion processing by prior setting of the height position (stationary position) of the semiconductor wafers 1. The semiconductor wafers 1 have oxidation and diffusion processing performed by reacting with the process gas ($O_2$) while being heated.

Figure 4:
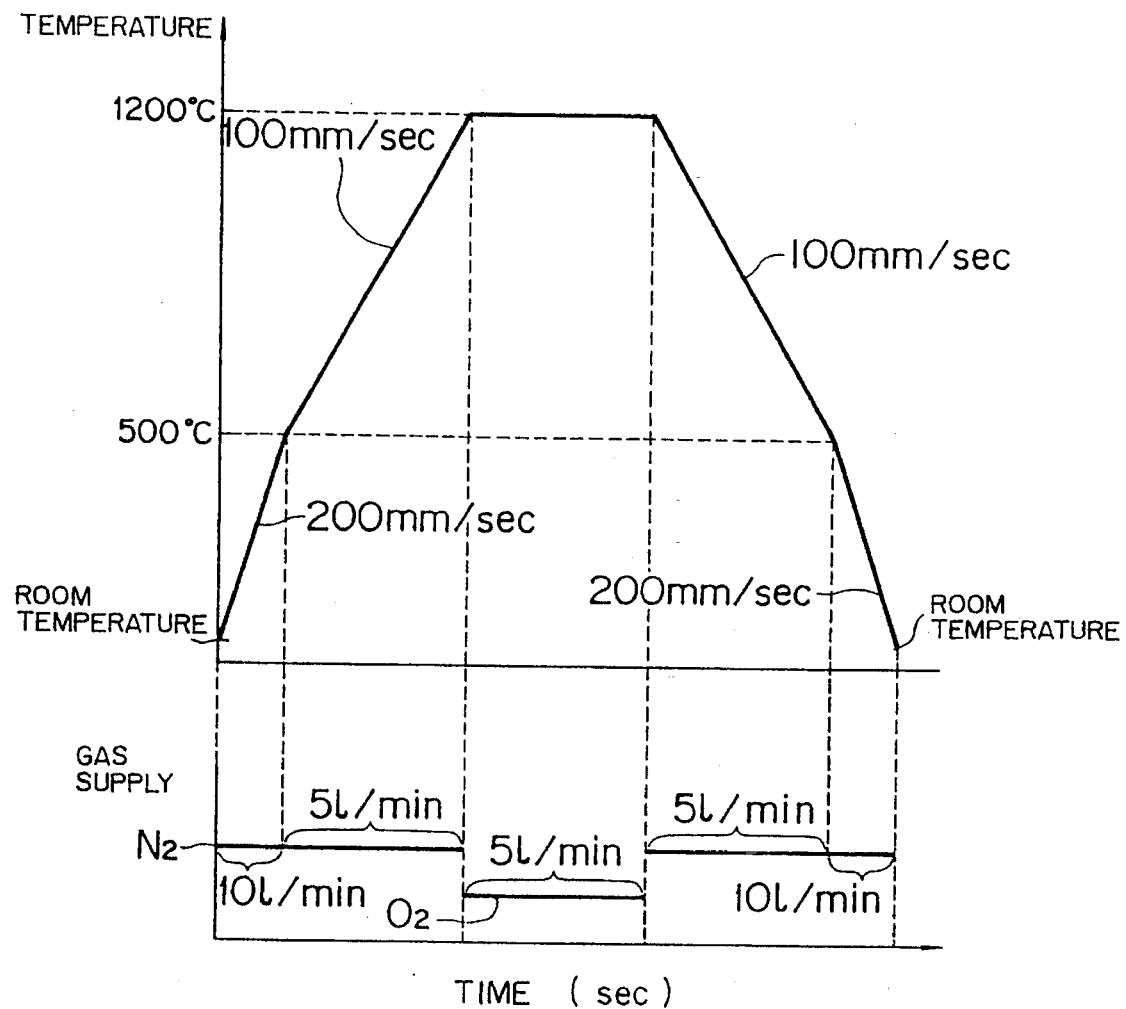
FIG. 4 is a view describing one example of a heat treatment mode in oxidation and diffusion processing by the heat treatment apparatus of the present invention.

FIG. 4 is a view describing one example of a heat treatment mode in oxidation and diffusion processing by the heat treatment apparatus of the present invention. The temperature of the flat heat source 2 is in a status of a constant temperature of 1300° C. for example, and nitrogen gas ($N_2$) is made to flow through the process tube 7 (at a flow rate of 10 lit./min. for example) while the wafer holder 3 is raised at a speed of 200 mm/sec. so that the temperature of the semiconductor wafer 1 rises from room temperature to approximately 500° C.

When the temperature of the semiconductor wafer 1 has risen to approximately 500° C., the wafer holder 3 is raised even further at a speed of 100 mm/sec. for example while nitrogen gas ($N_2$) is made to flow (at a rate of 5 lit./min. for example).

When the temperature of the semiconductor wafer 1 has risen to approximately 1200° C., the wafer holder 3 is fixed at that position, the supply of nitrogen gas ($N_2$) is stopped, and oxidation and diffusion processing is performed while there is the supply of the process gas ($O_2$) (at a rate of 5 lit./min. for example).

When this oxidation and diffusion processing has finished, a procedure the reverse of this is used to cool the semiconductor wafer 1 to room temperature.

Figure 5:
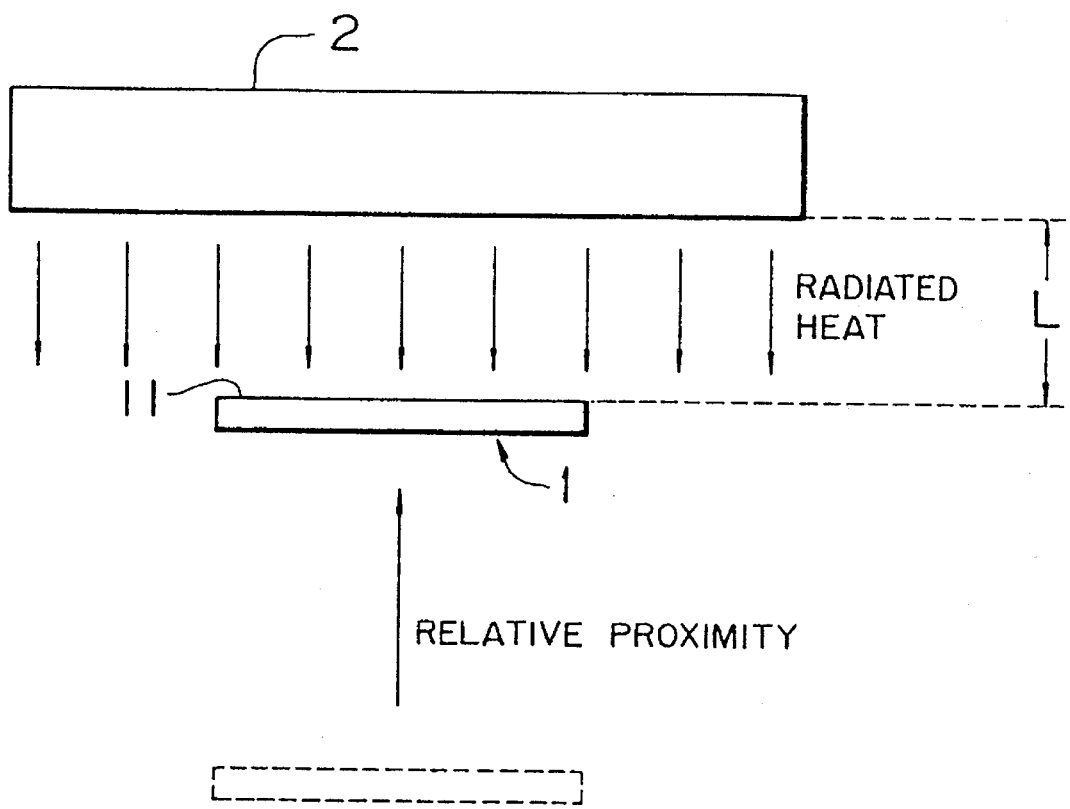
FIG. 5 is a view describing the heating operation by the flat heat source.

As shown by the arrow in FIG. 5, according to a heat treatment apparatus of the present invention, the heat radiated from the flat heat source 2 is in a substantially perpendicular direction with respect to the processing surface (upper surface) 11 of the semiconductor wafer 1. Because of this, even if the outer diameter of the semiconductor wafer 1 is large as 12 inches for example, it is possible to have uniform heating of the entire processing surface 11 and also have have fast heating since the semiconductor wafer 1 and the flat heat source 2 are quickly brought into relative proximity by the raising action of the wafer holder 3 for example. As a result, it is possible to have heat treatment performed without the generation of slip, distortion or warping of the semiconductor wafers 1. In addition, it is also possible to have fast heat treatment which meets the requirements of semiconductor wafers of large diameters, and of fineness of the design rules for recent semiconductor devices. Accordingly, there is a remarkable effect exhibited in various types of heat treatment such as doping processing to 50–100 Å very thin film growth of gate oxidation films and capacitor insulation films, formation of shallow PN junctions of 0.1 μm or less, formation of LOCOS oxidation films, and other types of capacitor insulation film growth using materials having highly dielectric conductors.

Moreover, when the semiconductor wafer 1 and the flat heat source 2 are quickly brought into close proximity, the flat heat source 2 can be fixed and the semiconductor wafer 1 can be raised, or the semiconductor wafer 1 can be fixed and the flat heat source 2 lowered.

The speed of movement is desirably a speed so that the temperature rise of the processing surface 11 of the semiconductor wafer 1 is for example, 20° C./sec or more, or preferably, 100° C./sec. or more.

Moreover, when when the semiconductor wafer 1 and the flat heat source 2 are quickly brought into close proximity and the semiconductor wafer 1 heated, changing the design value for the minimum distance L between the semiconductor wafer 1 and the flat heat source 2 enables a plural number of different types of heat treatment to be performed. More specifically, by changing the design value for the minimum distance L between the semiconductor wafer 1 and the flat heat source 2, it is possible to set the maximum temperature of heating of the semiconductor wafer 1 to a required value. Because of this, it is possible to suitably select high temperature processing at temperatures of 1200° C. for example, or low temperature processing at temperatures of 500° C. for example.

Second Embodiment

The following is a description of a second embodiment, which is a heat treatment apparatus suitable for performing CVD processing to a semiconductor wafer.

Figure 6:
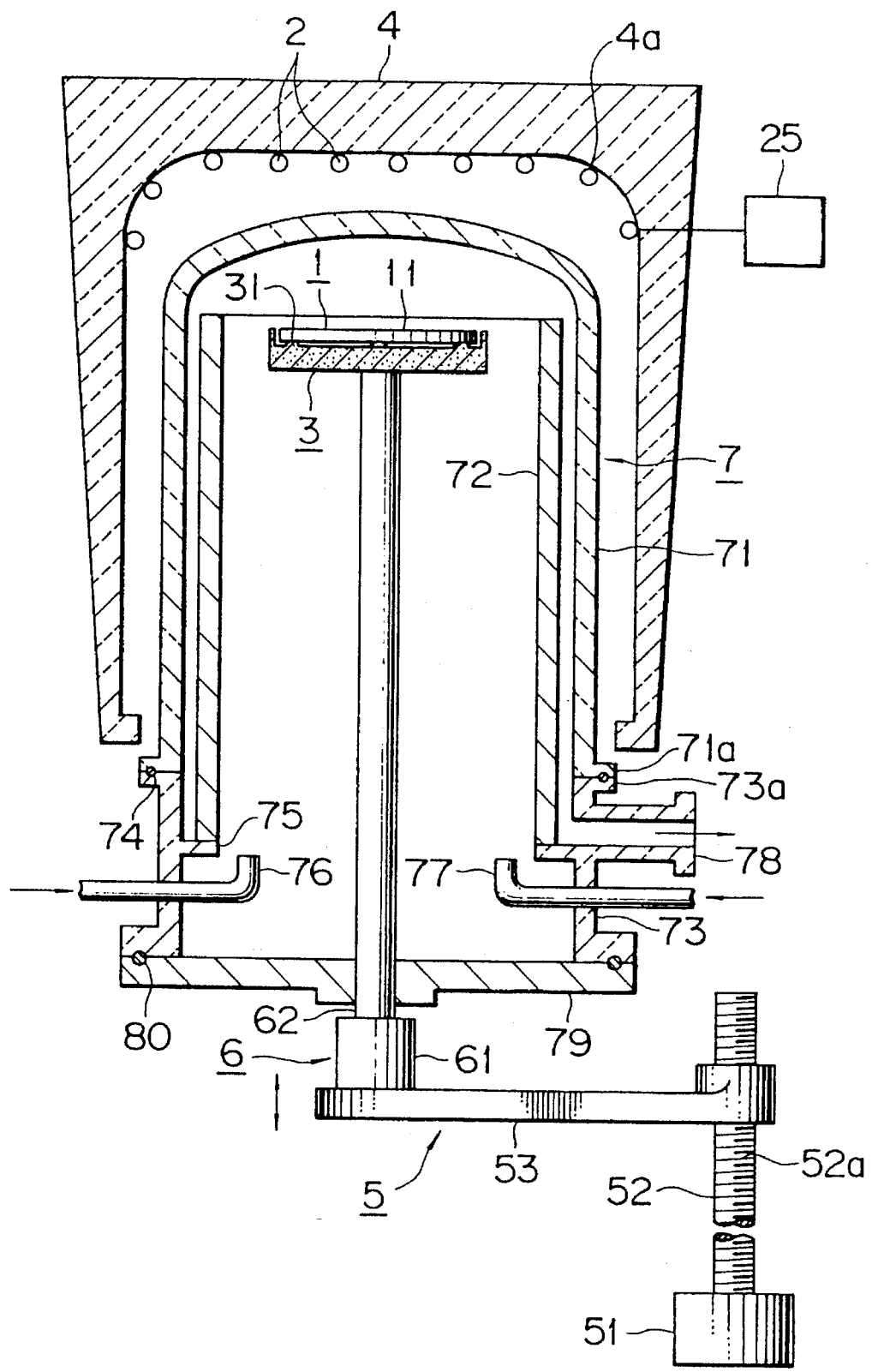
FIG. 6 is an outline view of a second and third embodiment of the heat treatment apparatus of the present invention, for the performance of CVD processing to semiconductor wafers.

FIG. 6 is an outline view of a second embodiment of the heat treatment apparatus of the present invention and is configured from a wafer holder 3, a movement mechanism 5 and a rotation mechanism 6.

The flat heat source 2 housed inside the heat retention material 4 has a shape wherein the peripheral edge 4a is curved in the direction closer to the semiconductor wafers 1. There is normally a larger heat discharge from the peripheral portion 4a of a semiconductor wafer 1 than there is at the center and so curving the peripheral portion of the flat heat source 2 in the direction so that it approaches the semiconductor wafer 1 enables control of the heat discharge of the peripheral portion of the semiconductor wafer 1 and makes the temperature more uniform across the entire surface of the semiconductor wafers 1. The inner wall of the upper portion of the heat retention material 4 is shaped so as to receive the curved peripheral edge portion of the flat heat source 2.

The process tube 7 has a double-tube structure provided with an outer tube 71 and an inner tube 72, with the outer tube 71 comprised of a heat resistant material such as silica glass ($SiO_2$), with the upper end closed and the lower end having a cylindrical shape with an opening. The inner tube 72 is cylindrical in shape with openings at both the upper and the lower end, and is arranged on the same axis and with a gap between it and the outer tube 71. The gas which rises from the upper portion opening of the inner tube 72 passes through the gap between the inner tube 72 and the outer tube 71 and is exhausted to the outside.

The bottom opening of the outer tube 71 and the inner tube 72 engage with a manifold 73 which is comprised of stainless steel or the like, and the outer tube 71 and the inner tube 72 are held by this opening. This manifold 73 is fixed to a base (not shown).

The end portion of the upper portion opening of the manifold 73 and the lower portion of the outer tube 71 are respectively provided with ring flanges 71a and 73a, with an O-ring 74 of a pliant material being placed between the flanges 71a, 73a and airtightly sealing between the two. The lower end portion of the inner tube 72 is held by a holding portion 75 formed so as to protrude from the middle stage to the inside of the inner wall of the manifold 73.

A first gas introduction pipe 76 comprised of silica glass for example, and which is curved in the direction of the heat treatment portion towards the top, passes through one side of the lower portion of the manifold 73 via a sealing member (not shown), and supplies a film growth gas such as dichloryl-silane ($SiH_2Cl_2$) to the inside of the process tube 7. This first gas introduction pipe 76 is connected to a gas supply source (not shown).

A second gas introduction pipe 77 comprised of silica glass for example, and which is curved in the direction of the heat treatment portion towards the top, passes through another side of the lower portion of the manifold 73 via a sealing member (not shown), and supplies a film growth gas such as ammonia ($NH_3$) to the inside of the process tube 7. This second gas introduction pipe 77 is connected to a gas supply source.

To the upper portion of the manifold 73 is connected an exhaust pipe 78 which is connected to a vacuum pump (not shown), and which exhausts the processing gas which flows down the gap between the outer tube 71 and the inner tube 72, to outside of the system so that the inside of the process tube 7 is set to a required reduced pressure atmosphere.

To the opening of the lower end of the manifold 73 is detachably mounted a circular cap portion 79 of stainless steel or the like, via an O-ring 80 of a pliant material and so as to be airtight.

To substantially the center portion of this circular cap portion 79 passes a rotating shaft 62 which can rotate in an airtight status because of a magnetic seal or the like. This rotating shaft 62 is a rotating shaft of the wafer holder 3 and to its lower portion is connected a motor 61 to rotate it at a required speed.

This motor 61 is fixed to a drive arm 53 of a movement mechanism 5 so that the raising and lowering of the drive arm 53 raises and lowers the cap portion 79 and the rotating shaft 62 as a unit, and loads and unloads the wafer holder 3 to and from the inside of the process tube 7.

The following is a description of the CVD processing operation using the heat treatment apparatus shown in FIG. 6. First, the wafer holder 3 is lowered by the movement mechanism 5 and unloaded. One semiconductor wafer 1 is held in the wafer holder 3. After this, the flat heat source 2 is driven and heat is generated, and the atmosphere at the highest position of the wafer holder 3 is heated to a uniform temperature of 700° C. for example. Then, the movement mechanism 5 raises the wafer holder 3 so that it is loaded to the inside of the process tube 7 and the internal temperature of the process tube 7 is maintained at 700° C. for example. Then, after the inside of the process tube 7 has been exhausted to a required vacuum status, the rotation mechanism 6 rotates the wafer holder 3 and also rotates the semiconductor wafer 1 held on top of it. At the same time, a film growth gas such as dichloryl-silane ($SiH_2Cl_2$) gas is introduced from the first gas introduction pipe 76 and a film growth gas such as ammonia ($NH_3$) is introduced from the second gas introduction pipe 77. The supplied film growth gases rise inside the process tube 7 and are supplied from the top of the semiconductor wafer 1 and uniformly with respect to the semiconductor wafer 1. The inside of the process tube 7 is exhausted via the exhaust pipe 78 and the pressure is controlled to within a range of 0.1–0.5 Torr, and is for example. 0.5 Torr, and film growth is performed for the required time.

When there is the completion of film growth processing to the semiconductor wafer 1 in this manner, there is the replacement of the processing gas inside the process tube 7 with an inert gas such as $N_2$ or the like so that there can be shift to film growth processing for the next semiconductor wafer 1, and the internal pressure is raised to normal pressure. After this, the movement mechanism 5 lowers the wafer holder 3 and the wafer holder 3 and the processed semiconductor wafer 1 are taken from the process tube 7.

The processed semiconductor wafer 1 on the wafer holder 3 which has been unloaded from the process tube 7 is exchanged with an unprocessed semiconductor wafer which is loaded into the process tube 7 and has film growth processing performed to it in the same manner as described above.

Third Embodiment

In the heat treatment apparatus shown in FIG. 6, the wafer holder 3 can be fixed and the flat heat generation source 2 is raised and lowered. In addition, when the processed semiconductor wafers 1 are taken out, the flat heat generation source 2, the heat retention material 4 and the outer tube 71 can be raised first raised, and then the inner tube 72 raised.

According to a configuration where the wafer holder 3 is fixed in this manner, there is less mechanical impact received by the semiconductor wafers 1 and so it is possible to have no damage to the thin film on the semiconductor wafer 1, and furthermore, the mechanism of the heat treatment apparatus can be simplified since it is not necessary to move the manifold 73.

Fourth Embodiment

In this fourth embodiment, the flat heat source 2 is fixed at a position to an inner wall of the upper portion of the heat retention material 4 which is for example, immediately above and facing the processing surface of the semiconductor wafer 1. Moreover, as shown in FIG. 1, this flat heat source 2 can be arranged so that it is immediately above the processing surface of the semiconductor wafer 1 or immediately below the processing surface of the semiconductor wafer 1.

Figure 7:
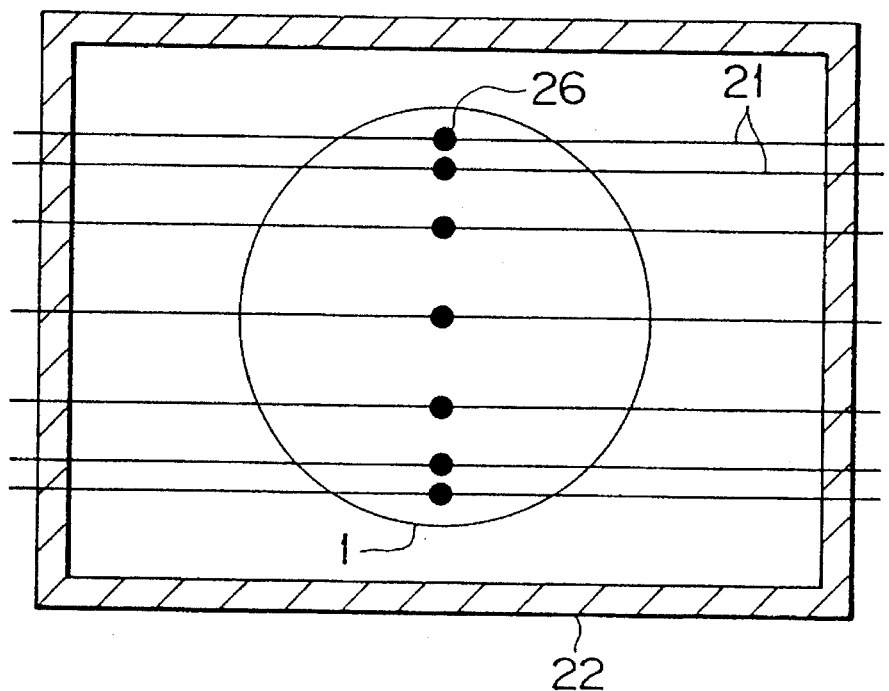
FIG. 7 is a horizontal sectional view a fourth embodiment of the heat treatment apparatus of the present invention and is a linear heat source used as the flat heat source.
Figure 8:
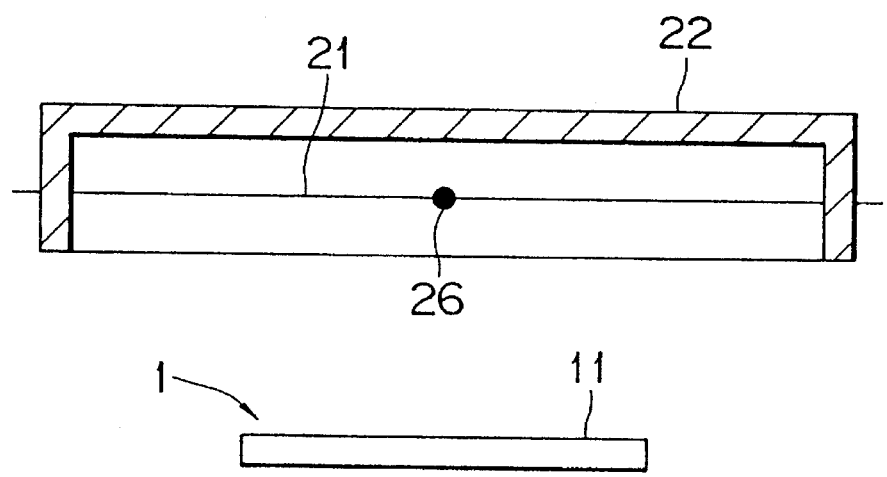
FIG. 8 is a vertical sectional view of the linear heat source shown in FIG. 7.

As shown in FIG. 7 and FIG. 8, this fourth embodiment is configured with a plural number of linear heating units arranged in parallel to the heat retention material 22. The plural number of linear heating units 21 are configured so that they are arranged in parallel with the heat retention material 22. The heat retention material 22 is comprised of high-purity silicon-carbide (SiC). From the point of view of preventing any adverse influence to to electromagnetism, the two adjacent linear heating units 21 which extend in the same direction should desirably have current flow through them so that the magnetic flux is cancelled. In addition, the pitch of parallel arrangement of the linear heating units 21 is desirably so that they are spaced more apart at the center and becoming more dense towards the periphery of the flat heat source 2 so as to control the heat discharge at the periphery of the semiconductor wafer 1 and ensure uniformity of heating. In addition, it is also desirable that they be arranged symmetrically left and right about the center of the flat heat source 2, for the same reasons.

Each of the linear heating units 21 is provided with a temperature sensor 26 comprising a thermocouple, and this temperature sensor 26 is connected to a heating control portion 25 (See FIG. 1). The heating control portion 25 uses signals from the temperature sensors 26 as the basis for independent control of each of the ring-shaped heating units 21. Moreover, there can be completely independent heating control for each of the linear heating units 21 or there can be control so that the heating units are suitably grouped into a plural number of groups which are then controlled.

In addition, instead of using a temperature sensor 26 to detect the temperature of each of the linear heating units 21 of the flat heat source 2, a radiant heat gauge can be used to directly measure the temperature for each of the linear bands of the semiconductor wafer 1, and the detection signals can be used as the basis for performing temperature control by the heating control portion 25.

Figure 9:
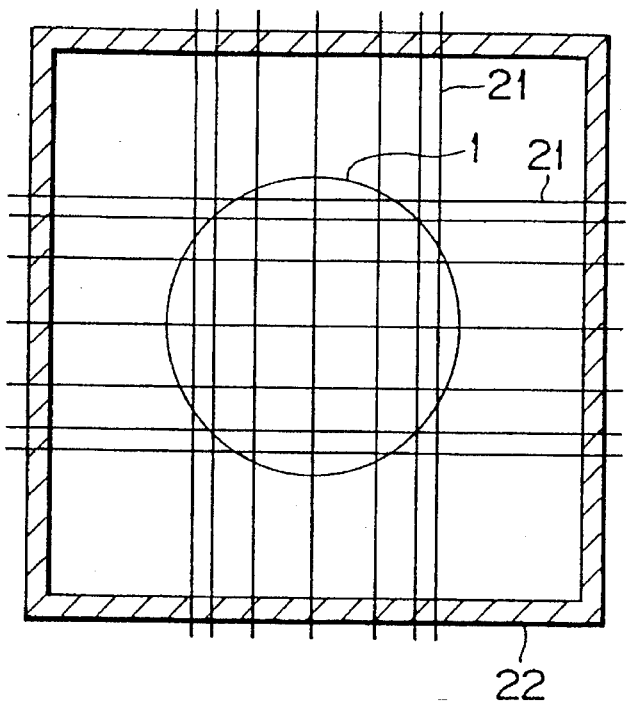
FIG. 9 is a horizontal sectional view showing another example of a flat heat source.

As shown in FIG. 9, the linear heating units 21 need not be arranged in one direction only, but can be arranged so that they cross each other longitudinally and laterally. Moreover, in this case, the portions of the linear heating units 21 which cross are electrically insulated from each other.

Figure 10:
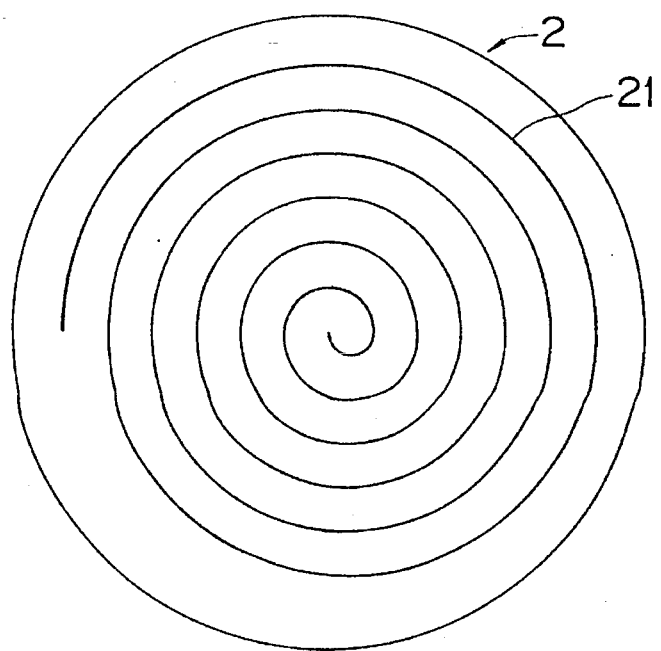
FIG. 10 is a plan view showing the arrangement of a flat spiral heat source.

In addition, as shown in FIG. 10, a resistance heating unit 21 can be configured from a single wire of molybdenum silicide ($MoSi_2$) for example.

Fifth Embodiment

The following is a description of a fifth embodiment of a heat treatment apparatus using the present invention, and which is suitable for performing oxidation and diffusion processing for semiconductor wafers.

FIG. 11 is an outline view of a fifth embodiment of the heat treatment apparatus of the present invention, and is the same as the first embodiment shown in FIG. 1 in that it is provided with a semiconductor wafer 1, a flat heat source 2 and a wafer holder 3.

The fifth embodiment is provided with a heat storage portion 30 of a size which extends past the outer peripheral edge of the semiconductor wafer 1, to a position facing the rear surface on the opposite side of the processing surface 11 of the semiconductor wafer 1. This maintains uniformity of temperature inside the processing surface 11.

Figure 12:
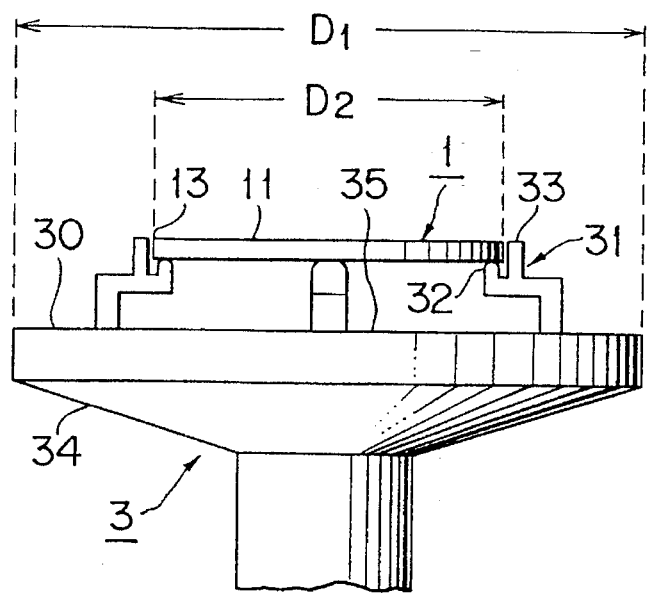
FIG. 12 is a plan view of the heat storage portion shown in FIG. 11.
Figure 13:
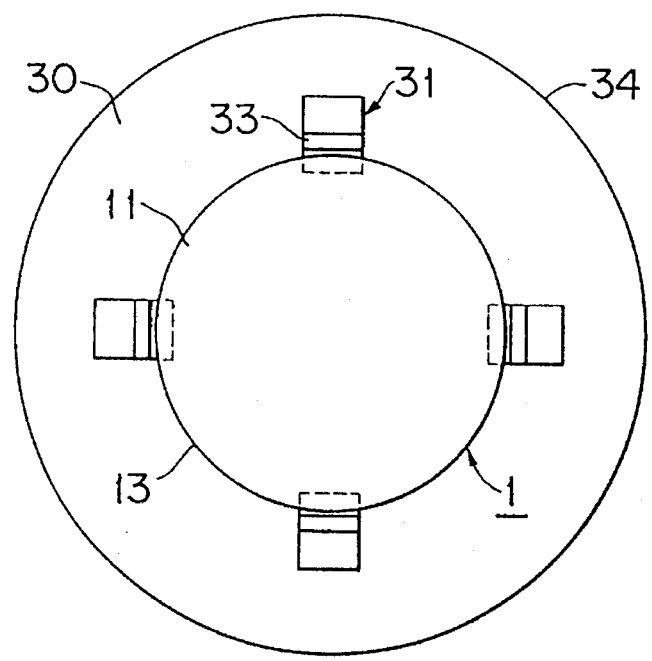
FIG. 13 is a side view of the heat storage portion shown in FIG. 12.

In this fifth embodiment, the heat storage portion 30 is also part of the wafer holder 3. More specifically, as shown in FIG. 12 and FIG. 13, the wafer holder 3 has a holding portion 31 which holds the semiconductor wafer 1 at a plural number of points, such as for example, 3 to 5, and this holding portion 31 is fixed to a base 34 which is part of the heat storage portion 30. Here, the numeral 32 represents a holding protrusion and 33 represents a stopper. The distal end of the holding protrusion 32 is rounded so as to not damage the semiconductor wafer 1.

The surface 35 of the heat storage portion 30 and which opposes the semiconductor wafer 1 is circular in shape as is the semiconductor wafer 1, and its outer diameter $D_1$ is desirably 50 mm or more larger than the diameter $D_2$ of the semiconductor wafer 1. When the outer diameter $D_2$ of the semiconductor wafer 1 is 8 inches for example, it is desirable that $D_1$ be 300 mm or more, and when the outer diameter $D_2$ of the semiconductor wafer 1 is 12 inches for example, it is desirable that $D_1$ be 400 mm or more. The thickness of the heat storage portion 30 is desirably 10 mm or more so as to obtain a favorable heat storage effect.

Figure 14:
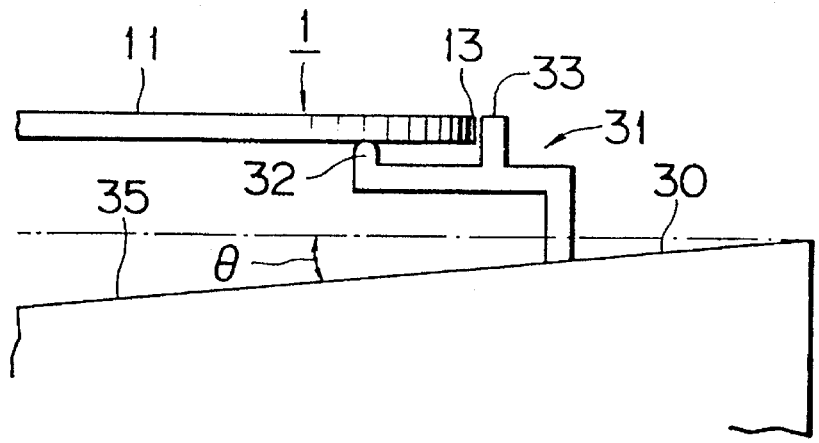
FIG. 14 is a side view of the main portions of the heat storage portion.

Also, as shown in FIG. 14, it is also desirable that the opposing surface 35 of the heat storage portion 30 be inclined at the angle θ towards the direction which approaches the semiconductor wafer 1 and from the center to the periphery. This angle θ can be uniform or can change. However, if this angle θ becomes too large, then the opposing surface 35 of the heat storage portion 30 will come too close to the outer peripheral portion of the semiconductor wafer 1 and will conversely obstruct heat discharge, and adversely effect the uniformity of temperature. For this reason, the angle θ is desirably from 5° to 15°.

Figure 15:
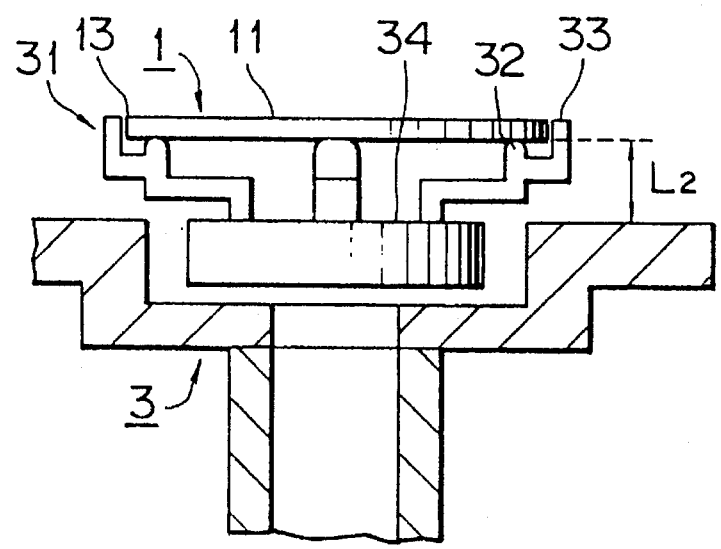
FIG. 15 is an outline view of another embodiment of the heat storage portion.

Furthermore, as shown in FIG. 15, the heat storage portion 30 and the wafer holder 3 can be separately configured.

In this case, the the outer diameter of the base 34 of the wafer holder 3 is smaller than the semiconductor wafer 1 and there is a ring-shaped heat storage portion 30 arranged concentrically to the side of the outer periphery of the base 34. This ring-shaped heat storage portion 30 moves up and down independently of the wafer holder 3 and therefore suitably adjusts the gap distance $L_2$ between the semiconductor wafer 1 and the heat storage portion 30 so that it is possible to have heat treatment with even higher uniformity.

Sixth Embodiment

Figure 16:
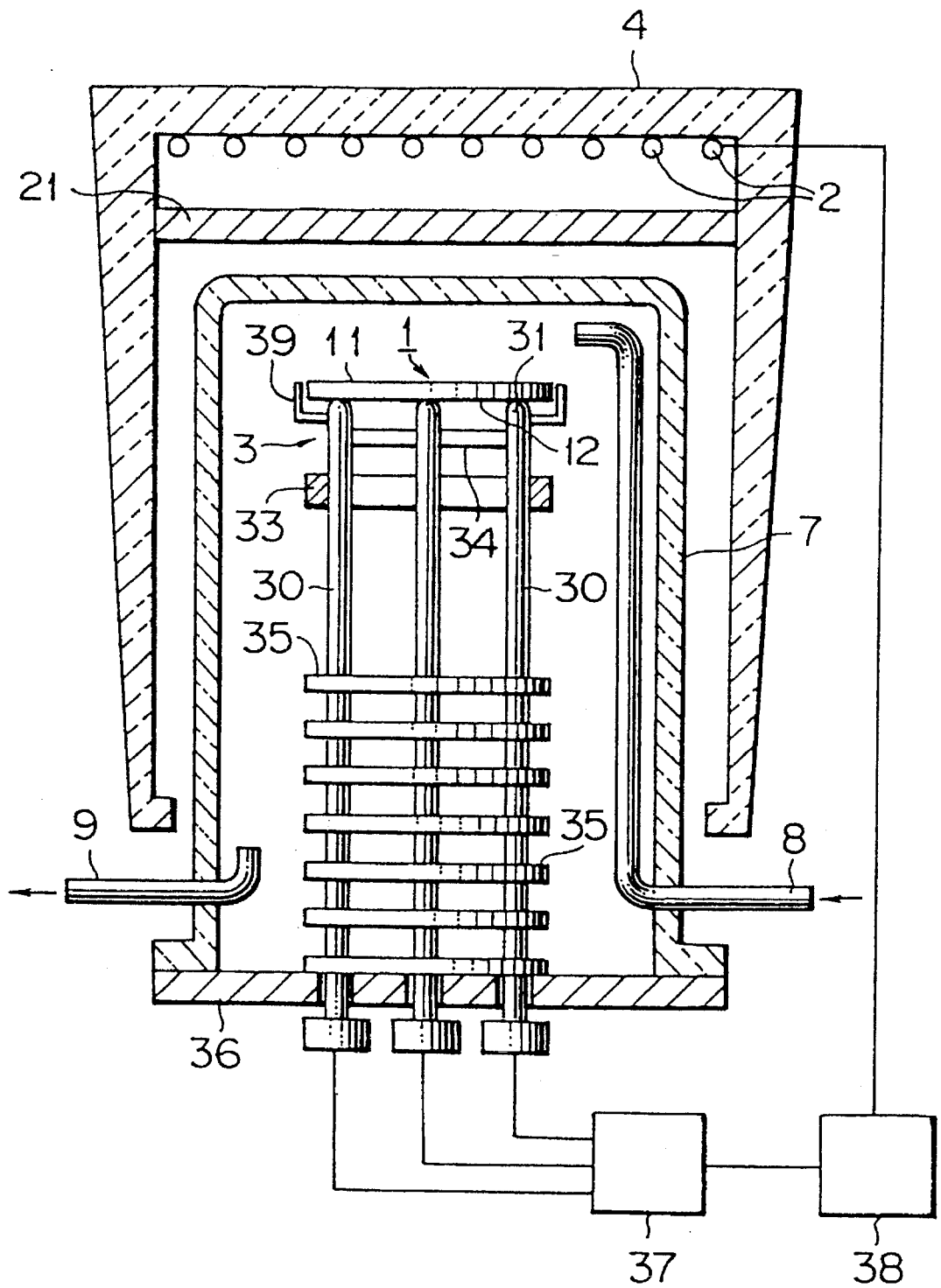
FIG. 16 is an outline view of a sixth embodiment of the heat treatment apparatus of the present invention, and shows the arrangement of the thermocouple to the semiconductor wafer support unit.
Figure 17:
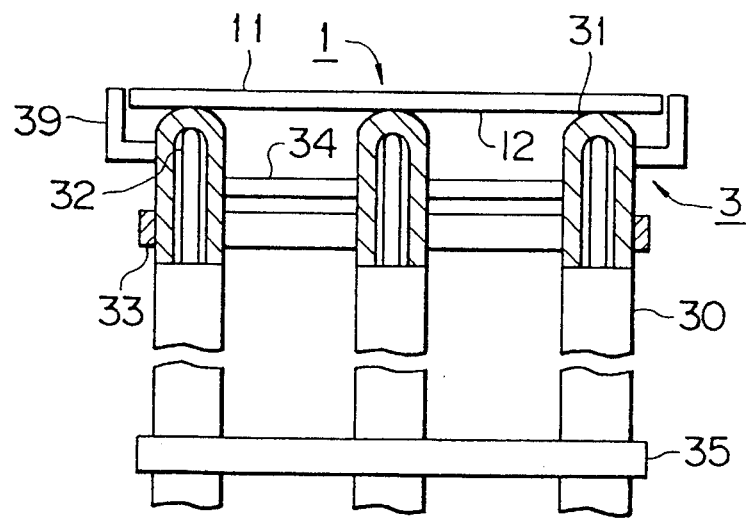
FIG. 17 is a front view of the main portions shown in FIG. 16.
Figure 18:
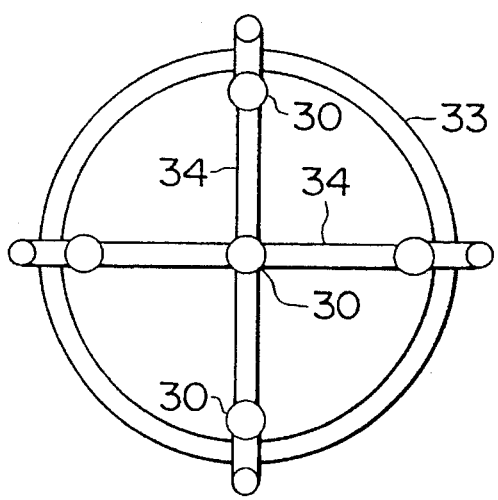
FIG. 18 is a plan view of the main portions shown in FIG. 16.

FIG. 16 is an outline view of a sixth embodiment of the heat treatment apparatus of the present invention, and shows the arrangement of the thermocouple to the semiconductor wafer support unit, while FIG. 17 is a front view of the main portions and FIG. 18 is a plan view.

The wafer holder 3 is mainly configured from a total of five support units 30 which extend downwards. The distal ends 31 of these support units 30 are arranged so that they are in contact at the horizontal level with the side of the rear surface 12 which is opposite the processing surface 11 of the semiconductor wafer 1. The semiconductor wafer 1 is loaded onto these distal ends 31 of these support units 30 and is supported. Of the five support units 30, one is in contact with the center portion of the semiconductor wafer 1 while the remaining four are in contact at equal distances around the peripheral portion of the semiconductor wafer 1. Moreover, the semiconductor wafer 1 is sufficiently supported if these support units 30 are provided at at least three positions.

Each of the support units 30 is cylindrical in shape and has a closed distal end 31, inside of which is a thermocouple 32 used as the temperature sensor and which is in contact with the inner wall of the distal end. These thermocouples 32 indirectly measure the temperature of each portion of the semiconductor wafer 1, via the distal ends 31 of the support units 30. The thermocouples 32 are separated from the process tube and are therefore protected from contamination.

The lead portions of the thermocouples 32 pass through the cap portion 36 and extend externally, and are connected to a detector circuit 37 disposed externally. The signals from this detection circuit are used as the basis for the control of the temperature of the flat heat source 2.

Figure 19:
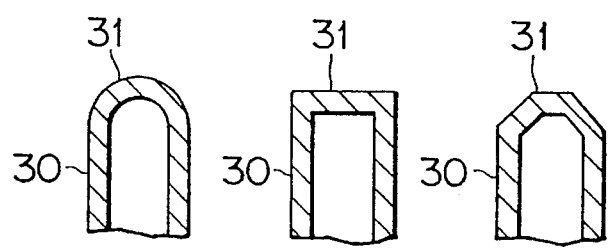
FIG. 19 is a vertical sectional view sowing the shape of the distal end of the support unit.

As shown in FIG. 19, the shape of the distal end 31 of a support units 30 can have either spherical, flat or tapered.

A reinforcing ring 33 links the four support units 30 in contact with the peripheral portion of the semiconductor wafer 1. In addition, the support unit 30 in contact with the center portion of the semiconductor wafer 1 is connected by reinforcing rods 34 to each of the support units 30 in contact at the peripheral portion.

To the lower portion 30 of the support units 30 are arranged a plural number of sheets of heat insulation material 35 to interrupt the flow of heat in the radial direction. These heat insulation plates 35 prevent heating of the cap portion 36. These heat insulation plates 35 are desirably configured from a material such as silica glass for example, which has a high heat resistance. A wafer guide 39 of silica glass for example, is linked to the support units 30 on the peripheral portion.

Here, the support units 30, the reinforcing ring 33, the reinforcing rod 34, the heat insulation plates 35 and the like are comprised of a material such as high-purity carbon silicide (SIC), silica glass or sapphire for example, which has excellent heat resistance and little contamination. In particular, high-purity carbon silicide (SIC) has a superior heat resistance than does silica glass ($SiO_2$) in that it can sufficiently withstand temperatures of approximately 1200° C. and is therefore suitable as a material for oxidation and diffusion processing.

In this sixth embodiment, a radiated heat gauge can be used instead of the thermocouple to measure the temperature of the semiconductor wafer. In this case, the support units 30 transparent rods, are arranged with detection portions having radiated heat gauges facing the end surface on the side fixed to the cap 36, and act as light paths.

According to this sixth embodiment, it is possible to have heat treatment to a uniform temperature for across the entire surface of a flat semiconductor wafer.

Seventh Embodiment

In this seventh embodiment, an auxiliary heat source 30 having a size which extends past the peripheral edge 13 of the semiconductor wafer 1 is arranged at a position facing the rear surface 12 on the side opposite the processing surface 11 of the semiconductor wafer 1.

Figure 21:
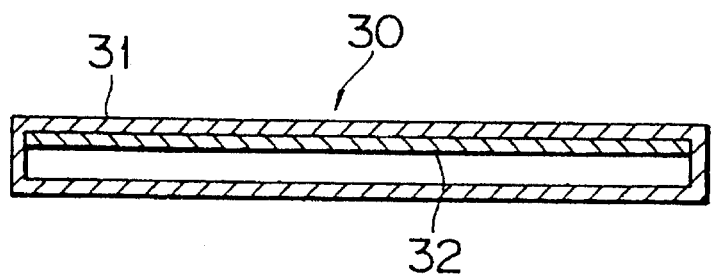
FIG. 21 is a vertical sectional view of one example of the auxiliary heat source shown in FIG. 20.

There are no particular limitations on the specific configuration of this auxiliary heat source 30 but as shown in FIG. 21, it is desirable that the structure be such that the heater 32 is sealed inside the plate-shaped central cavity 31. The material of this plate-shaped central cavity 31 is a material which has a high heat resistance and little contamination, such as glass, silicon carbide (SIC) or the like.

Figure 20:
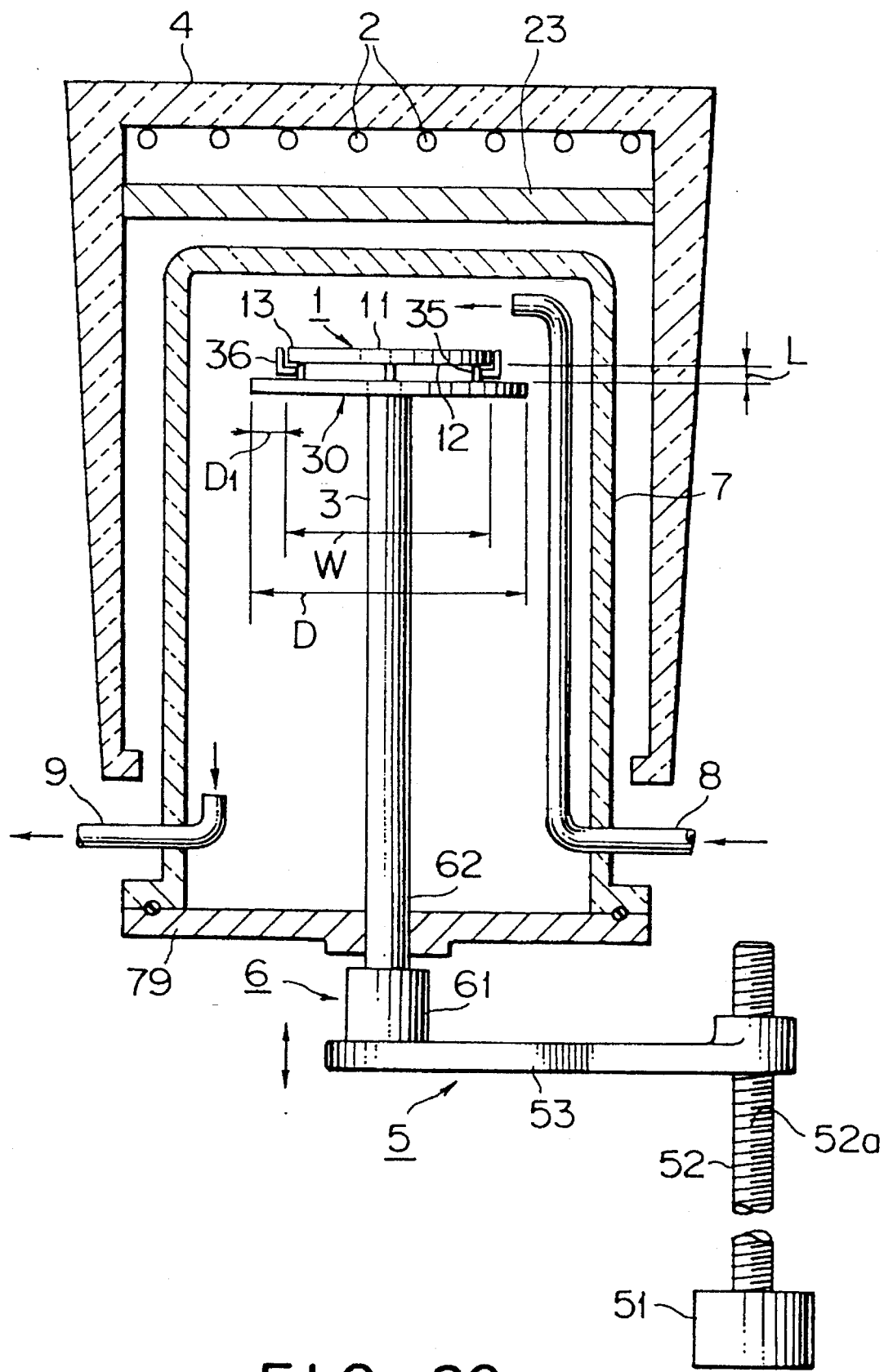
FIG. 20 is an view showing a seventh embodiment of the heat treatment apparatus of the present invention, and shows an auxiliary heat source provided.

The size of the plate unit 31 is sufficient if it extends past the peripheral edge 13 of the semiconductor wafer 1. More specifically, as shown in FIG. 20, it is desirable if the outer diameter D of the plate unit 31 be for example, 50 mm or more larger than the outer diameter W of the semiconductor wafer 1. For example, when the outer diameter W of the semiconductor wafer 1 is 8 inches, it is desirable that D be 300 mm or more, and for example, when the outer diameter W of the semiconductor wafer 1 is 12 inches, it is desirable that D be 400 mm or more. In addition, the gap distance L between the plate unit 31 and the semiconductor wafer 1 should desirably be in the range of $0.5\ D \leq L \leq 1.0\ D$ in its relationship with the length $D_1$ of the extension portion of the plate unit 31. The shape of the plate unit is desirably the same shape as the surface of the semiconductor wafer 1 and is normally circular.

The heater 32 can be configured of a resistance heat generating material such as Kanthal (trade name) wire which is an alloy wire of molybdenum silicide ($MoSi_2$), iron (Fe), chromium (Cr) and aluminum (Al). For example, it is possible to use molybdenum silicide ($MoSi_2$) as wires and Kanthal as coils. In particular, molybdenum silicide ($MoSi_2$) can sufficiently withstand high temperatures of up to approximately 1800° C. and so it is a favorable material for an apparatus for the oxidation and diffusion processing. Also, a material which has little contamination is high-purity carbon silicide (SiC) or graphite (C) which have been surface coated carbon silicide (SiC).

There are no particular limitations on the arrangement shape of the heater 32 and the can for example, be a spiral shape, a plural number of concentric rings, a shape which is arranged in a plural number in one direction and parallel to each other, or a shape where a plural number are arranged laterally and longitudinally so as to cross each other.

Figure 22:
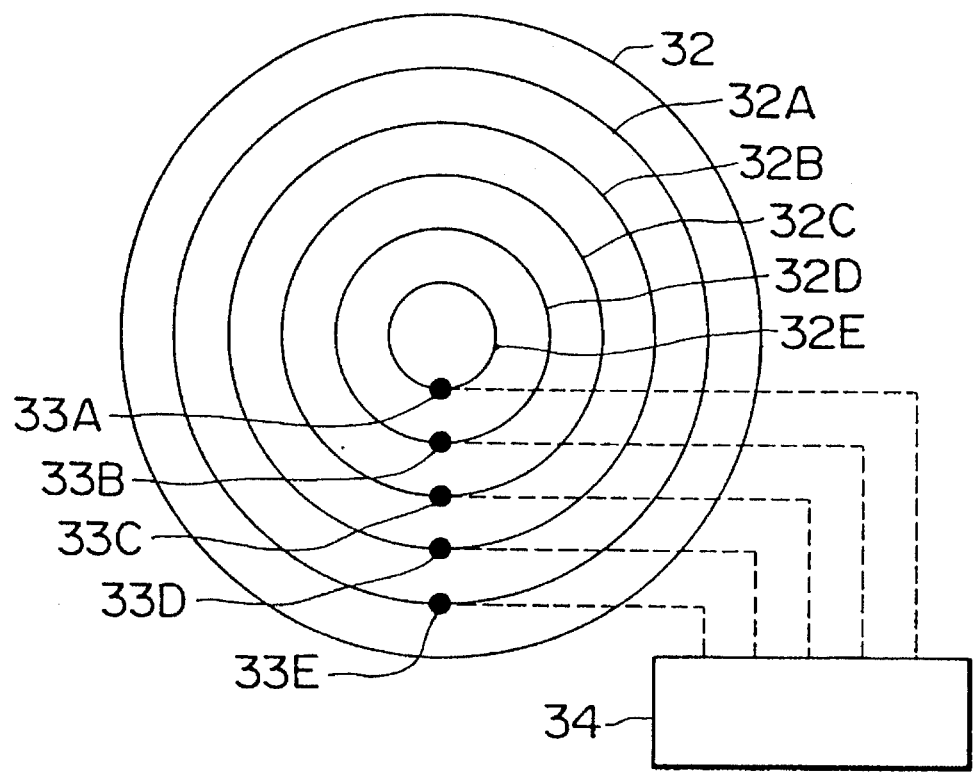
FIG. 22 is an outline view of the heating zone of the auxiliary heat source shown in FIG. 20.

As shown in FIG. 22, it is desirable that the heater 32 be divided into a plural number of zones 32A–32E, and that each zone be capable of having independent heating control. Such independent heating control for each zone enables the uniformity of temperature within the surface of the semiconductor wafer 1 to be even more uniform.

In FIG. 22, 33A–33E are temperature sensors which are thermocouples for example, and the detection signals of these temperature sensors are used as the basis for the heating control portion 34 to perform heating control of the heaters 32 for each zone. Moreover, the temperature of the rear surface 12 of the semiconductor wafer 1 can be directly measured by temperature sensors such as thermocouples or the like, and those detection values can be used as the basis for heating control by the heating control portion 34.

The wafer holder 3 can be formed as a unit with the auxiliary heating portion 30, or can be separate. More specifically, as shown in FIG. 20, the auxiliary heating portion 30 can be combined with one portion of the wafer holder 3. The wafer holder 3 has holding protrusions 35 which hold the semiconductor wafer 1 at several points, such as 3 to 5, for example, and these holding protrusions 35 are fixed to the auxiliary heating portion 30. In this figure, the numeral 36 is a stopper. The distal end of the holding protrusions 35 are rounded so as not to damage the semiconductor wafer 1.

The holding protrusions 35 and the stopper 36 are desirably comprised of a material such as high-purity carbon silicide (SIC) for example, which has excellent heat resistance and little contamination. In particular, high-purity silicon-carbide (SIC) can sufficiently withstand temperatures of approximately 1200° C. and is therefore suitable as a material for oxidation and dispersion processing.

Eighth Embodiment

Figure 23:
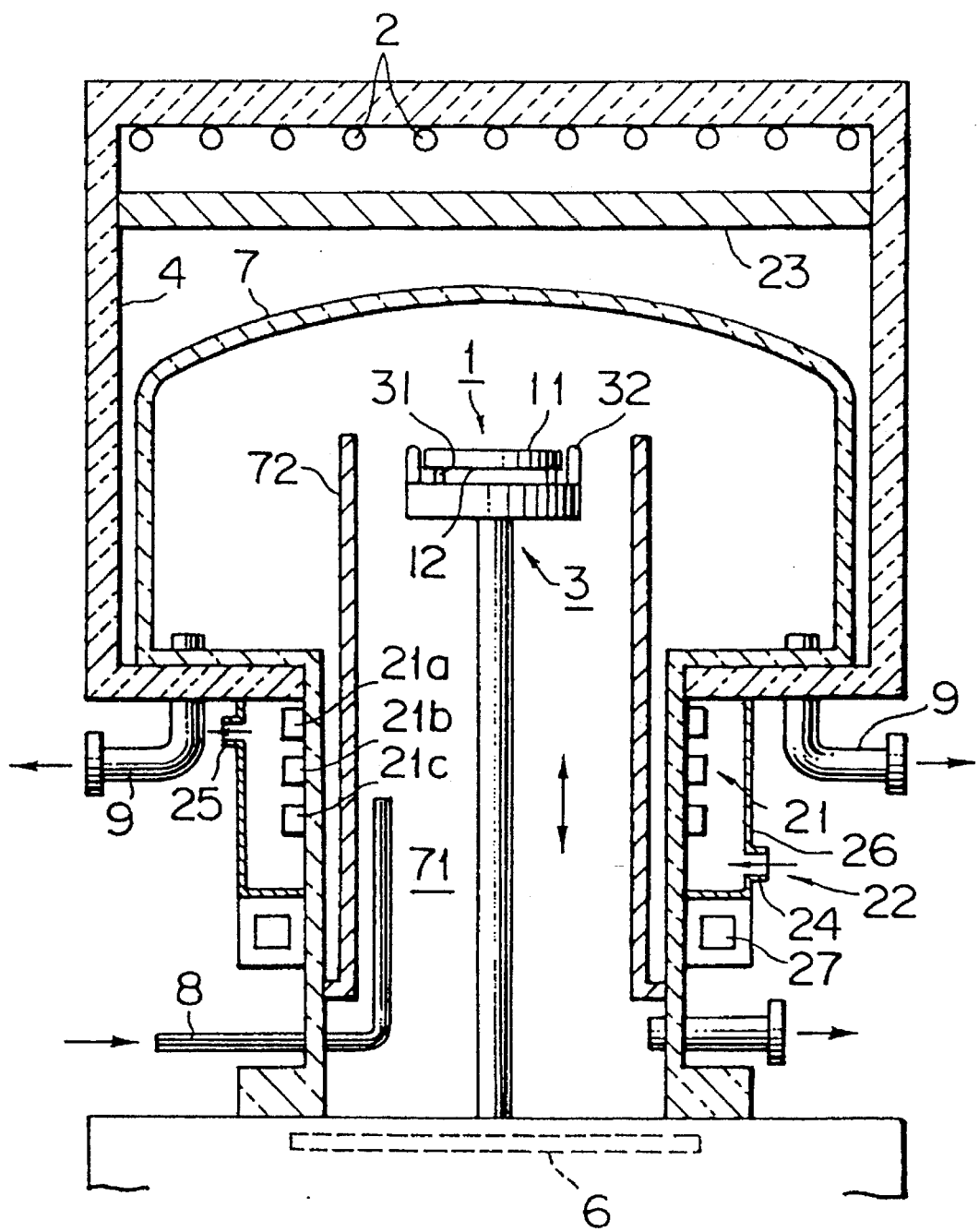
FIG. 23 is a view showing an eighth embodiment of the heat treatment apparatus of the present invention, and shows the narrowing of the space on the side of the entrance/exit opening of the process tube, and the auxiliary heater provided to that portion.

FIG. 23 is a view showing an eighth embodiment of the heat treatment apparatus of the present invention. This eighth embodiment is mainly comprised of a semiconductor wafer 1 which is the flat object for processing, a flat heat source 2, a wafer holder 3, heat retention material 4, an inner cylinder 5, radial heat prevention plates 6, a process tube 7, a gas introduction pipe 8 and a gas exhaust pipe 9, and the like.

In FIG. 23, 71 is an space on the side of the entrance/exit opening of a process tube comprised of high-purity glass ($SiO_2$) for example, and this entrance/exit opening space 71 narrows. In this embodiment, the narrowing of the process tube 7 itself narrows the entrance/exit opening space 71. This narrowing of the entrance/exit opening space 71 makes it difficult for process gas to remain in the entrance/exit opening space 71 and improves the uniformity of temperature on the surface of the semiconductor wafer 1 when it is being raised and lowered. In addition, this narrowing of the entrance/exit opening space 71 enables the thermal capacity of the entrance/exit opening space 71 of the process tube to be reduced, and therefore enable faster heating with lesser energy, while fast cooling is easily attained by the cooling means 22, 27 to be described later. Furthermore, the narrowing of the process tube 7 also makes an airtight seal with the external atmosphere structurally simple.

To the outer periphery of the entrance/exit opening space 71 is provided an auxiliary heater 21.

In this eighth embodiment, there are the three auxiliary heaters 21a, 21b and 21c, for the upper, middle and lower zones respectively, and each has independent temperature control. More specifically, temperature sensors (not shown) such as thermocouples are provided to the auxiliary heater of each zone, and the detection signals from these temperature sensors are used as the base for control of the amount of heat generated by each of the auxiliary heaters.

There are no particular limitations on the specific configuration of the auxiliary heaters but a transparent resistance heating film can be directly provided to the outer peripheral surface of the narrow portion of the process tube. A configuration where there is direct provision of a resistance heating film to the outer peripheral surface of the narrow portion of the process tube is simple to configure, enables the entire apparatus to be lightweight, and is easy to handle. In addition, the resistance heating film is transparent and so enables the use of television cameras or the like for monitoring of the status inside the process tube 7. The material of the resistance heating film is desirably, that tin dioxide ($SnO_2$) for example but the present invention is not limited to this.

Furthermore, as shown in FIG. 23, to the outer side to which the auxiliary heaters 21 are arranged is desirably provided a cooling means 22 to forcibly cool the auxiliary heaters 21.

With only the auxiliary heaters 21, it is difficult to have the fast temperature control required for natural cooling since cooling time is required even after the power is switched off but forcibly cooling the auxiliary heaters 21 by the provision of a cooling means 22 enables prompt cooling. In addition, it is also possible to the temperature change while the semiconductor wafer 1 is being raised up and lowered down the process tube 7 to be extremely accurate and linear with the distance that the semiconductor wafer 1 has moved, thereby increasing the uniformity of temperature on the surface of the semiconductor wafer 1.

The specific configuration of the cooling means 22 is also not limited to the configuration described here, but a means which uses nitrogen gas ($N_2$) as the cooling gas which flows around the outer periphery of the auxiliary heaters 21 can be used, for example.

In addition, 26 represents a cylinder for configuring a cooling gas supply path, and the cooling gas is introduced from the cooling gas supply pipe 24 at the lower portion of this cylinder 26, and is discharged from the cooling gas exhaust pipe 25 at the top portion. The positions of the cooling gas supply pipe 24 and the cooling gas exhaust pipe 25 are not limited to those described, and it is possible to have relative freedom of design.

To the lower end portion of the process tube 7 is desirably provided a cooling means 27 for quickly cooling the entrance/exit opening space 71 of the process tube 7 after heat treatment. This cooling means can use a cooling medium such as ammonia, iodine disulfide, water or the like. The cooling medium uses its latent heat to cool to a temperature of approximately 300°–400° C.

Figure 24:
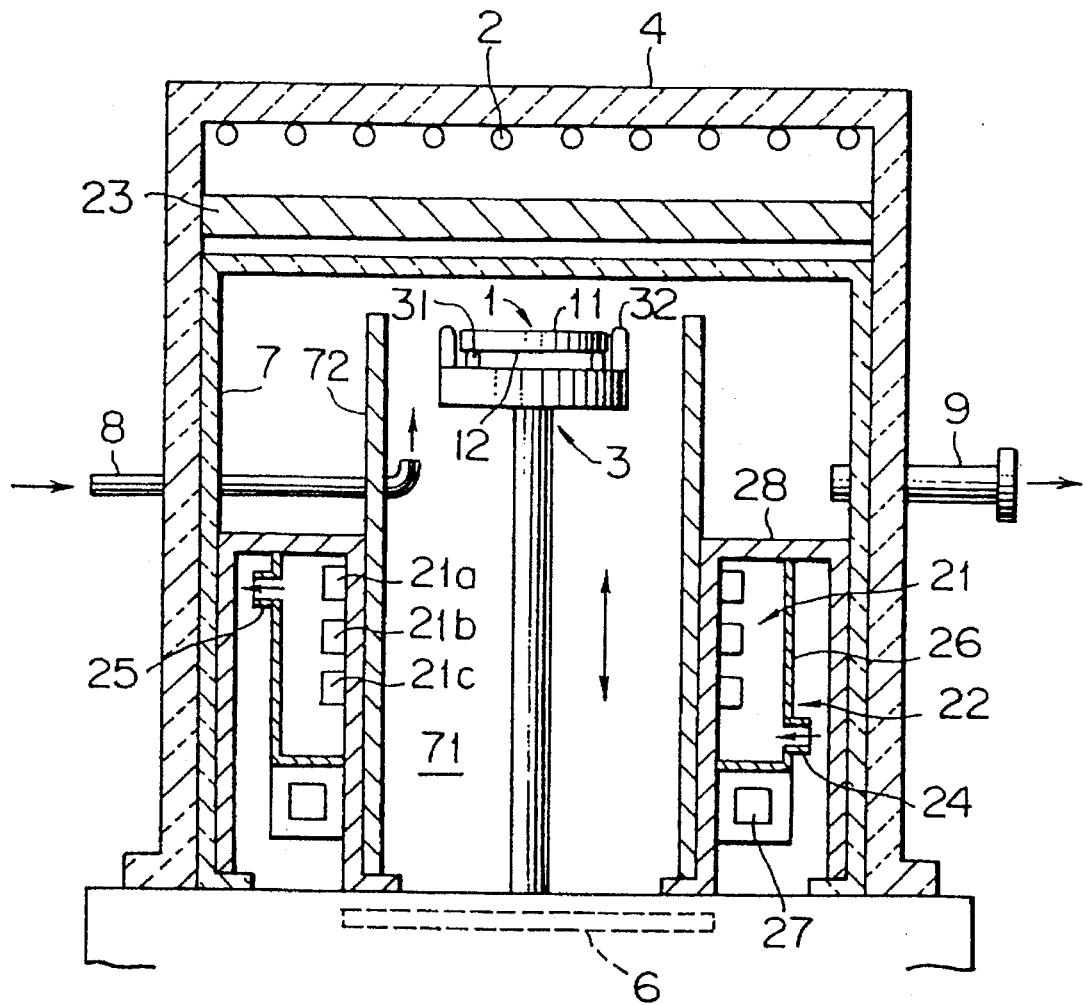
FIG. 24 is an outline view of an auxiliary heater provided inside a process tube which has no narrowing.

In addition, as shown in FIG. 24, the auxiliary heater 21, the cooling means 22 for the auxiliary heater 21 and the cooling means 27 for the process tube 7 are arranged without the process tube 7 itself narrowing. This effectively narrows the configuration of the entrance/exit opening space 71.

Here, the numeral 28 represents a partition member which, for example, is configured from a heat resistant material such as high-purity glass ($SiO_2$) for example. This partition member 28 airtightly partitions the auxiliary heater 21, the cooling means 22 for the auxiliary heater 21 and the cooling means 27 for the process tube 7 from the processing space.

Even if there is the configuration, it is possible to have a high uniformity of temperature within the surface of the semiconductor wafer 1 without residual process gas occurring inside the entrance/exit opening space 71 when the semiconductor wafer 1 is raised and lowered.

Ninth Embodiment

Figure 25:
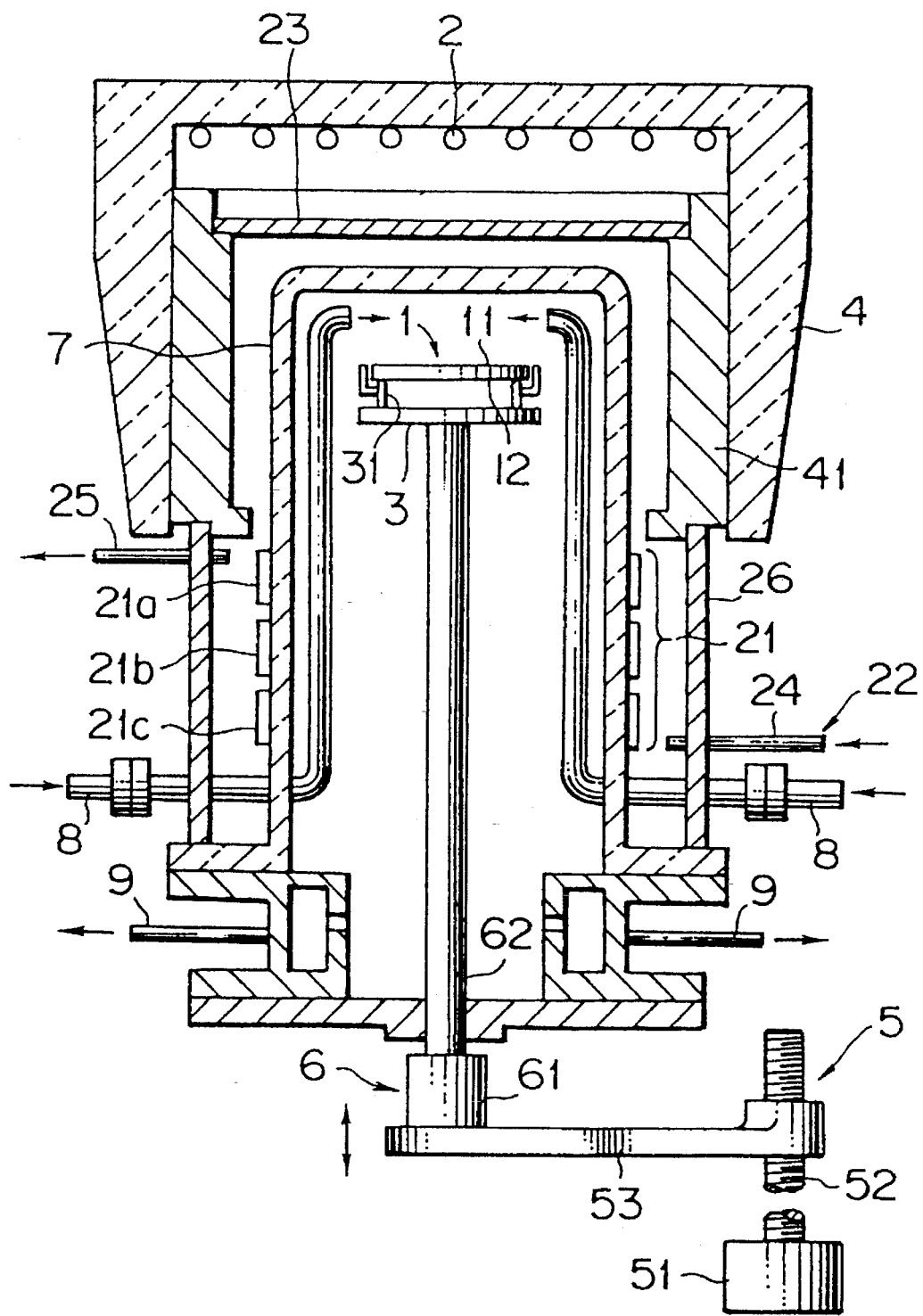
FIG. 25 is an outline view of a ninth embodiment of the heat treatment apparatus of the present invention, and shows the provision of an auxiliary heater to a peripheral surface close to the entrance/exit of the process tube.

As shown in FIG. 25, in the ninth embodiment, the auxiliary heater 21 is provided to the surface of the outer periphery of the entrance/exit of the process tube 7. In FIG. 25, the auxiliary heater 21 is divided into the three zones 21a, 21b and 21c corresponding to the upper stage, middle stage, and lower stage respectively, and independent temperature control is performed for each. More specifically, the auxiliary heater of each zone is respectively provided with a temperature sensor (not shown) and which is a thermocouple for example, and the detection signals from these temperature sensors are used as the basis for control of the amount of heat generated by each of the auxiliary heaters.

There are no particular limitations for the specific configuration of the auxiliary heater 21 but it is desirably configured so that a transparent resistance heating film is directly provided to the surface of the outer periphery of the process tube 7. Such a resistance heating film is simple to configure, enables the process tube 7 to be lightweight, and is easy to handle. In addition, the resistance heating film is transparent and so enables the use of television cameras or the like for monitoring of the status inside the process tube 7.

The material of the resistance heating film is desirably, that tin dioxide ($SnO_2$) for example but the present invention is not limited to this.

Furthermore, as shown in FIG. 25, to the outer side to which the auxiliary heaters 21 are arranged is desirably provided a cooling means 22 to forcibly cool the auxiliary heaters 21. With only the auxiliary heaters 21, it is difficult to have the fast temperature control required for natural cooling since cooling time is required even after the power is switched off but forcibly cooling the auxiliary heaters 21 by the provision of a cooling means 22 enables prompt cooling. In addition, it is also possible to the temperature change while the semiconductor wafer 1 is being raised up and lowered down the process tube 7 to be extremely accurate and linear with the distance that the semiconductor wafer 1 has moved, thereby increasing the uniformity of temperature on the surface of the semiconductor wafer 1.

The specific configuration of the cooling means 22 is also not limited to the configuration described here, but a means which uses a cooling gas which flows around the outer periphery of the auxiliary heaters 21 can be used, for example. In this figure, the numeral 24 represents a cooling gas supply pipe, and 25 represents a cooling gas exhaust pipe. 26 represents a cylinder for configuring a cooling gas supply path, and the cooling gas is introduced from the cooling gas supply pipe 24 at the lower portion of this cylinder 26, and is discharged from the cooling gas exhaust pipe 25 at the top portion. The cooling gas supply pipe 24 and the cooling gas exhaust pipe 25 are not limited to those described, and it is possible to have relative freedom of design.

Figure 26:
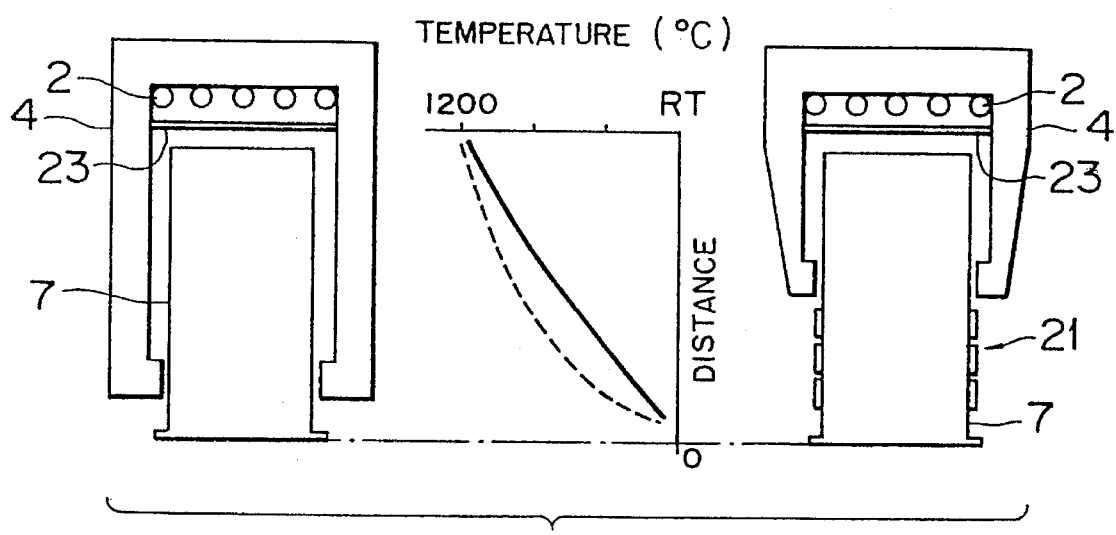
FIG. 26 is a view describing the differences in effect for with and without the provision of the auxiliary heater shown in FIG. 25.

FIG. 26 is a view describing the differences in effect for with and without the provision of the auxiliary heater of the present invention. In the heat treatment apparatus (B) which is not provided with an auxiliary heater, the relationship between the temperature and the movement distance of the semiconductor wafer 1 shown by the dotted line, is curved instead of linear, and it is necessary to have fairly precise control of the movement speed of the semiconductor wafer 1. However, in the case of the heat treatment apparatus (A) which is provided with an auxiliary heater, the relationship between the two is extremely precise and linear and so control of the movement speed of the semiconductor wafer 1 is facilitated, and it is possible to have a sufficiently high uniformity of temperature inside the surface of the semiconductor wafer 1.

The above has been a description of the present invention, based on embodiments therefor, but the heat treatment apparatus of the present invention can also be applied to normal-pressure processes, reduced-pressure processes and vacuum processes.

In addition, the flat object for processing is not limited to circular semiconductor wafers but can also be angular or some object for processing which has some other shape.

According to a semiconductor wafer processing apparatus of the present invention as has been described above, it is possible to have fast heat treatment to a uniform temperature for the entire processing surface of a flat object for processing.

What is claimed is:
1. A heat treatment apparatus comprising:
means for supporting a flat object to be processed with a processing surface thereof facing in a first direction;
a flat resistor heat generating source having a plural number of ring-shaped heating units of different diameters arranged concentrically on and suspended from a heat retention material so as to face in a direction opposite said first direction and be parallel with said object to be processed;
a heat control portion which performs independent control of said plural number of ring-shaped heating units;
a heat baffle member provided between said flat resistor heat generating source and said means for supporting an object to be processed, said heat baffle member having a central portion and peripheral portions, wherein, in a direction perpendicular to said processing surface of said object, said central portion thereof is relatively thicker than said peripheral portions thereof;
a process tube which houses said means for supporting an object to be processed and an object supported thereon, said process tube being arranged to extend below said heat generating source; and
a movement mechanism which brings said means for supporting an object to be processed and said flat resistor heat generating source into a position of relative proximity wherein, through said baffle member, said processing surface entirely opposes said heat generating source.

2. The heat treatment apparatus of claim 1, wherein said heat baffle member is made of SiC.

* * * * *